(12) United States Patent
Kitamura et al.

(10) Patent No.: US 11,088,649 B2
(45) Date of Patent: Aug. 10, 2021

(54) POWER CONVERSION UNIT

(71) Applicant: Mitsubishi Electric Corporation, Tokyo (JP)

(72) Inventors: Yasuhiko Kitamura, Tokyo (JP); Ryuichi Ishii, Tokyo (JP); Shozo Kanzaki, Tokyo (JP); Toshiyuki Yasutomi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 32 days.

(21) Appl. No.: 16/606,919

(22) PCT Filed: Apr. 27, 2017

(86) PCT No.: PCT/JP2017/016830
§ 371 (c)(1),
(2) Date: Oct. 21, 2019

(87) PCT Pub. No.: WO2018/198290
PCT Pub. Date: Nov. 1, 2018

(65) Prior Publication Data
US 2020/0195189 A1   Jun. 18, 2020

(51) Int. Cl.
*H02P 29/028* (2016.01)
*H02P 29/50* (2016.01)
(Continued)

(52) U.S. Cl.
CPC ............ *H02P 29/028* (2013.01); *B60L 15/20* (2013.01); *B60L 50/51* (2019.02); *B60L 50/60* (2019.02);
(Continued)

(58) Field of Classification Search
CPC ......... H02P 27/06; H02P 25/22; H02K 11/33; H02K 16/00; H02K 17/34; H02K 47/00; H02M 7/00; H02M 5/00; H02M 1/00; H05K 7/209; B60L 2220/00; B60L 15/32; B60L 3/003
See application file for complete search history.

(56) References Cited

U.S. PATENT DOCUMENTS 5,497,289 A * 3/1996 Sugishima ............ H02M 7/003
                                                     318/558
8,829,669 B2 * 9/2014 Hotta .................... H01L 23/473
                                                     257/712

(Continued)

FOREIGN PATENT DOCUMENTS

JP   2001-352767 A   12/2001
JP   2010-104204 A   5/2010

*Primary Examiner* — Said Bouziane
(74) *Attorney, Agent, or Firm* — Sughrue Mion, PLLC; Richard C. Turner

(57) ABSTRACT

Provided is a power conversion unit, in which a power smoothing capacitor is configured such that a plurality of unit capacitors as conductive polymer hybrid aluminum electrolytic capacitors are arrayed in a grid pattern and connected in parallel on a circuit board, and also connected to a plurality of unit modules of different phases via positive and negative bus bars arranged on both sides of the circuit board so that each group of several unit capacitors and each unit module are arranged close to each other, to thereby reduce wiring impedance of a power supply circuit and suppress noise generation.

8 Claims, 13 Drawing Sheets

(51) Int. Cl.
*B60L 50/60* (2019.01)
*B60L 50/51* (2019.01)
*H02M 7/00* (2006.01)
*H02P 25/22* (2006.01)
*H05K 1/02* (2006.01)
*H05K 1/18* (2006.01)
*B60L 15/20* (2006.01)
*H02P 27/06* (2006.01)

(52) U.S. Cl.
CPC ............ *H02M 7/003* (2013.01); *H02P 25/22* (2013.01); *H02P 27/06* (2013.01); *H02P 29/50* (2016.02); *H05K 1/0203* (2013.01); *H05K 1/181* (2013.01); *H02P 2201/03* (2013.01); *H05K 2201/066* (2013.01); *H05K 2201/10015* (2013.01)

(56) References Cited

U.S. PATENT DOCUMENTS

| | | | | |
|---|---|---|---|---|
| 9,425,707 B2 * | 8/2016 | Mutsuura | ............... | H02M 7/003 |
| 2004/0257841 A1 * | 12/2004 | Taguchi | ................ | H02M 7/003 |
| | | | | 363/40 |
| 2009/0251875 A1 * | 10/2009 | Nagashima | ........... | H01L 25/072 |
| | | | | 361/781 |
| 2011/0069466 A1 * | 3/2011 | Herron | .................. | H02M 7/003 |
| | | | | 361/803 |

* cited by examiner

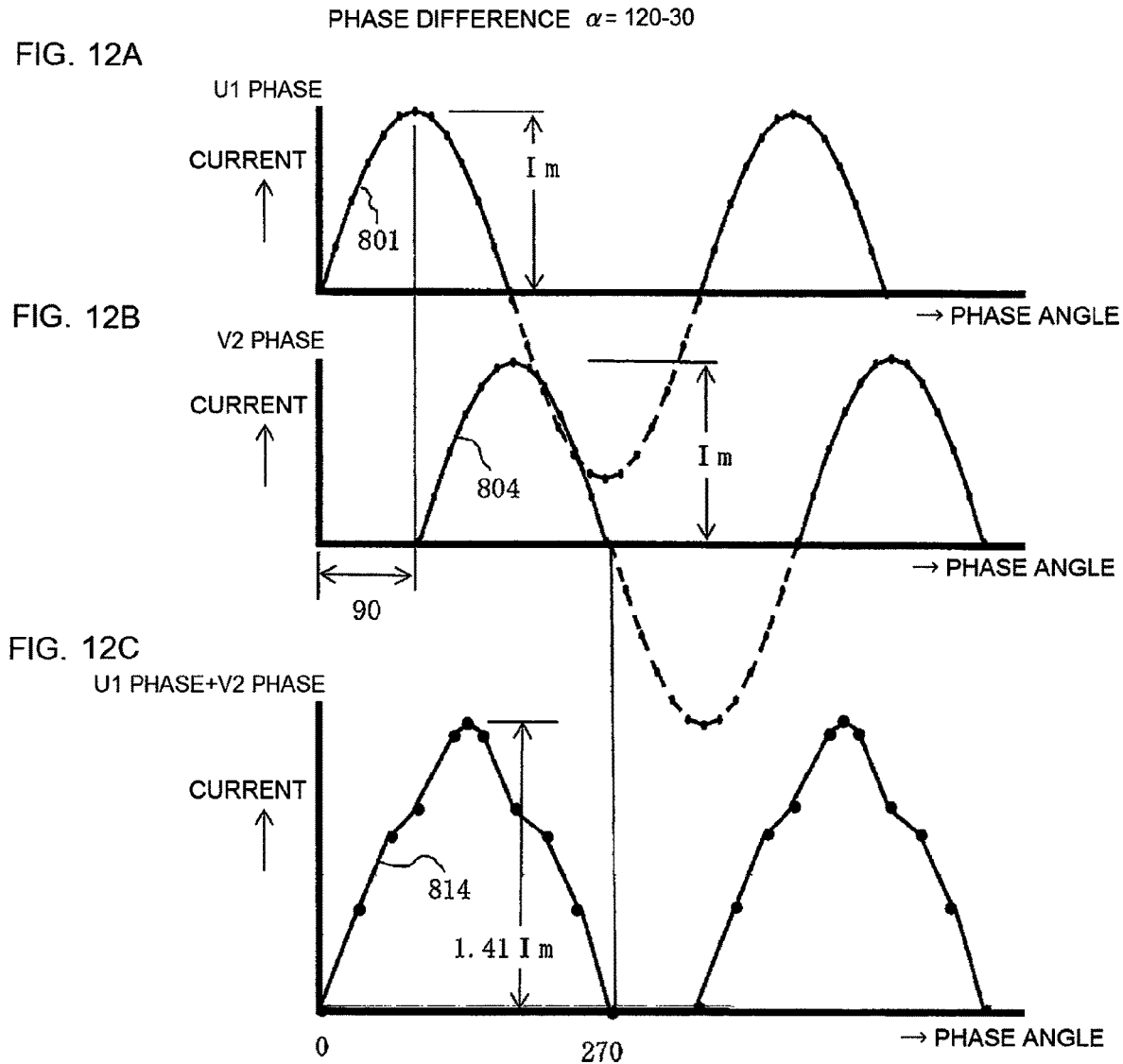

PHASE DIFFERENCE α = 120+30

POWER CONVERSION UNIT

CROSS REFERENCE TO RELATED APPLICATIONS

This application is a National Stage of International Application No. PCT/JP2017/016830 filed Apr. 27, 2017.

TECHNICAL FIELD

The present invention relates to a power conversion unit to be used, for example, in a drive circuit for a three-phase AC motor for vehicle traveling, and more particularly, to an improvement in component arrangement of a large-current power supply circuit in the power conversion unit.

BACKGROUND ART

The following power conversion unit has been broadly put to practical use. Specifically, the power conversion unit converts a DC voltage of an on-vehicle battery, which is configured to generate an output voltage of from 300 V to 400 V to an AC voltage, to rotationally drive a three-phase AC motor for vehicle traveling. Further, the power conversion unit rectifies, to a DC voltage, a three-phase AC generation voltage generated by inertial rotation of the motor at the time of down-hill driving or deceleration driving, to regenerate the on-vehicle battery. Examples of the motor (motor generator) used herein include: a motor having a set of windings of three phases that are U, V, and W phases; a motor in which winding operation of a thick wire, through which a large current flows, is facilitated with use of two intermediately thick wires that are wound and connected in parallel at an outlet of the motor to consequently form a set of three-phase windings; and a motor in which intermediately thick wires are separated into two sets of windings of three phases that are U1, V1, and W1 phases and U2, V2, and W2 phases.

Examples of an opening/closing module connected to the motor include: a module in which a set of three-phase AC voltages are generated to be supplied to a set of three-phase windings; a module of a double same three-phase system configured to operate with one set of three-phase AC voltages that corresponds to two sets of three-phase AC voltages that are in-phase voltages generated to be supplied to two sets of three-phase windings; and a module of a double inclined three-phase system in which a phase difference, for example, 30 degrees, is set in two sets of three-phase AC voltages, to thereby prevent rotational ripple fluctuation (cogging) of the motor. The double same three-phase system is aimed at dispersing generated heat of an opening/closing element configured to interrupt a motor current (load current).

Meanwhile, a power smoothing capacitor is used in a DC power supply portion in order to prevent pulsation and fluctuation of a power supply voltage associated with intermittent control of a load current, by the opening/closing module formed by integrating a plurality of opening/closing elements. Electrostatic energy stored in the above-mentioned capacitor is defined by the product of a square of a charged voltage and a capacitance, and hence a capacitor with a smaller capacitance can be used for storing the same electrostatic energy when a higher system voltage is set. In contrast, when a lower system voltage is set, a volume of the capacitor is reduced while a larger capacitance is needed, but attention needs to be paid on parallel connection of the capacitors, and equalization of branched ripple currents is required.

For example, according to FIG. 1 and FIG. 12 for a "power unit for a power converter" disclosed in Patent Literature 1, a smoothing capacitor 9 includes twenty-four unit capacitors 9u, which are presumed to be film capacitors and are intensively arrayed on a high current wiring board 15, and is connected to a power module 1 including six bipolar transistors so as to supply electricity to a three-phase motor 12. In the cases of FIG. 3 and FIG. 14, smoothing capacitors 9a and 9b each include twenty four×two unit capacitors 9u, which are presumed to be film capacitors and are intensively arrayed on the front and back sides of the high current wiring board 1. Further, the smoothing capacitors 9a and 9b are connected to a pair of power modules 1a and 1b each including six bipolar transistors, to supply electricity to a double three-phase motor 12a.

Meanwhile, according to FIG. 1, FIG. 2, and FIG. 17, and paragraphs 0025, 0026, and 0031 for a "power converter" disclosed in Patent Literature 2, for example, a voltage of 300 V from a DC power supply 12 is boosted to 600 V by a booster 11, and is applied to a capacitor 2, which is presumed to be a film capacitor, so that double three-phase AC motors 13 and 13 are supplied with electricity via six semiconductor modules 3 including two bipolar transistors 32a and 32b, which are positive and negative bipolar transistors. DC terminals 30 of the respective semiconductor modules 3 are separately connected by screwing to electrode terminals 20 of the capacitor 2 (see FIG. 17) so as to reduce dispersion of a current and a parasitic inductance.

CITATION LIST

Patent Literature

[PTL 1] Japanese Patent Application Laid-open No. 2001-352767
[PTL 2] Japanese Patent Application Laid-open No. 2010-104204

SUMMARY OF INVENTION

Technical Problem (1) Description of Problems of Related Arts

In the "power unit for a power converter" according to Patent Literature 1 described above, there is a problem in that, due to a large area of the wiring substrate on which a large number of unit capacitors are connected in parallel to each other and a long distance from the power module, a noise voltage is generated by a parasitic inductance and the ripple currents flowing in the large number of unit capacitors cannot be equalized.

In the "power converter" according to Patent Literature 2, the capacity of the capacitor and the number of capacitors used are reduced by increasing a voltage to shorten the distance between the module and the capacitor. However, there is a problem in that short-circuit preventive measures are required to be taken by increasing an insulating distance of each portion so as to increase voltage resistance, and the danger against an electric shock increases.

(2) Description of Object of Invention

It is an object of the present invention to provide a power conversion unit configured to supply AC power to a three-phase AC motor from a DC power supply of a reduced power supply voltage s in order to reduce damage by an electric shock, and more particularly, to a power conversion unit capable of dealing with an increase in drive current and an increase in capacitance of a power smoothing capacitor associated with lowering of a voltage, to thereby prevent a size increase.

Solution to Problem

A power conversion unit comprising: a power smoothing capacitor connected to a DC power supply; a plurality of unit modules, which are connected in series to three phase windings of a three-phase AC motor including first three phase windings or the first three phase windings and second three phase windings, and are configured to intermittently supply load current; and a control circuit unit configured to execute opening/closing control of the plurality of unit modules such that one type of three-phase AC voltage is applied to any one of the first three phase windings, and the first three phase windings and the second three phase windings, or two types of three-phase AC voltages having a predetermined phase difference therebetween are applied to the first three phase winding and the second three phase windings, and such that the three-phase AC voltages each have a relation having a variable frequency of the same frequency, wherein the power smoothing capacitor is configured by an assembly of a plurality of unit capacitors being conductive polymer solid aluminum electrolytic capacitors or conductive polymer hybrid aluminum electrolytic capacitors, the plurality of unit capacitors being connected in parallel through use of a circuit board, wherein, on the circuit board, a plurality of positive-side patterns and a plurality of negative-side patterns, each extending in a horizontal direction, are alternately arrayed in a vertical direction, such that corresponding ones of the plurality of unit capacitors are soldered in between adjacent ones of the positive-side patterns and the negative-side patterns, a lowermost one of the positive-side patterns is connected to a positive-side power supply terminal, and a lowermost one of the negative-side patterns is connected to a negative-side power supply terminal, wherein right ends of the plurality of positive-side patterns and left ends thereof are each connected to one another via a corresponding one of a copper-made or copper-alloy-made first positive-side bus bar and a copper-made or copper-alloy-made second positive-side bus bar.

Right ends of the plurality of negative-side patterns and left ends thereof are each connected to one another via a corresponding one of a copper-made or copper-alloy-made first negative-side bus bar and a copper-made or copper-alloy-made second negative-side bus bar, wherein the first positive-side bus bar and the first negative-side bus bar are configured to extend in parallel in the vertical direction, and are connected to corresponding ones of positive-side electrode terminals and negative-side electrode terminals of three unit modules that form a first opening/closing module out of the plurality of unit modules, and AC electrode terminals provided to the three unit modules are connected to the first three phase windings, and wherein the second positive-side bus bar and the second negative-side bus bar are configured to extend in parallel in the vertical direction, and are connected, when the second three phase windings are provided, to corresponding ones of positive-side electrode terminals and negative-side electrode terminals of three unit modules that form a second opening/closing module out of the plurality of unit modules, and the AC electrode terminals provided to the three unit modules are connected to the second three phase windings.

Advantageous Effects of Invention

As described above, the power conversion unit of the present invention includes the power smoothing capacitor configured to convert a DC power into an AC power to thereby drive the three-phase AC motor, the first opening/closing module or the first and second opening/closing modules each including the three unit modules, and the control circuit unit, in which the power smoothing capacitor is configured such that a plurality of unit capacitors as conductive polymer hybrid aluminum electrolytic capacitors are arrayed in parallel along a plurality of rows of circuit pattern on the circuit board, and are connected to the unit modules via the positive and negative bus bars provided on both sides of the circuit pattern.

As a result, a large number of small-capacity unit capacitors can be arrayed densely on the composite circuit board to reduce the size, and reduce a ripple current for each unit capacitor, thereby producing the effect of preventing a temperature rise due to an internal loss of the capacitor that is defined by the product of a ripple current proportional to a value of a capacitance C, a square value thereof, and an equivalent series resistance ESR, to prevent the life of the capacitor from being shortened. Further, the surface to which the plurality of unit capacitors are attached, is occupied by the power supply patterns except a small space required to isolate the positive and negative circuit patterns, and the positive and negative circuit patterns are connected via the copper-made or copper-alloy-made bus bars. This arrangement produces an effect of reducing wiring impedance between the positive and negative power supply terminals connected to the DC power supply, the positive and negative power supply terminals of the plurality of unit capacitors, and the positive and negative electrode terminals of the unit modules to thereby suppress noise generation. Further, when the unit capacitors are surface-mounted components, the unit capacitors can be soldered together with the positive and negative bus bars through one soldering process to thereby shorten a working process. Note that the conductive polymer hybrid aluminum electrolytic capacitor is impregnated with an electrolyte that promotes repair of an oxide film that serves as a dielectric member of the capacitor. Such a capacitor functions to avoid a short-circuit failure that may occur due to a self-repairing action thereof, and in turn, to withstand high voltage to thereby improve a reliability.

BRIEF DESCRIPTION OF DRAWINGS

FIGS. 12A-12C are graphs for showing a characteristic curve of a waveform of a second added current in the power conversion unit of FIG. 9.

DESCRIPTION OF EMBODIMENTS

First Embodiment (1) Detailed Description of Configuration

Figure 1:
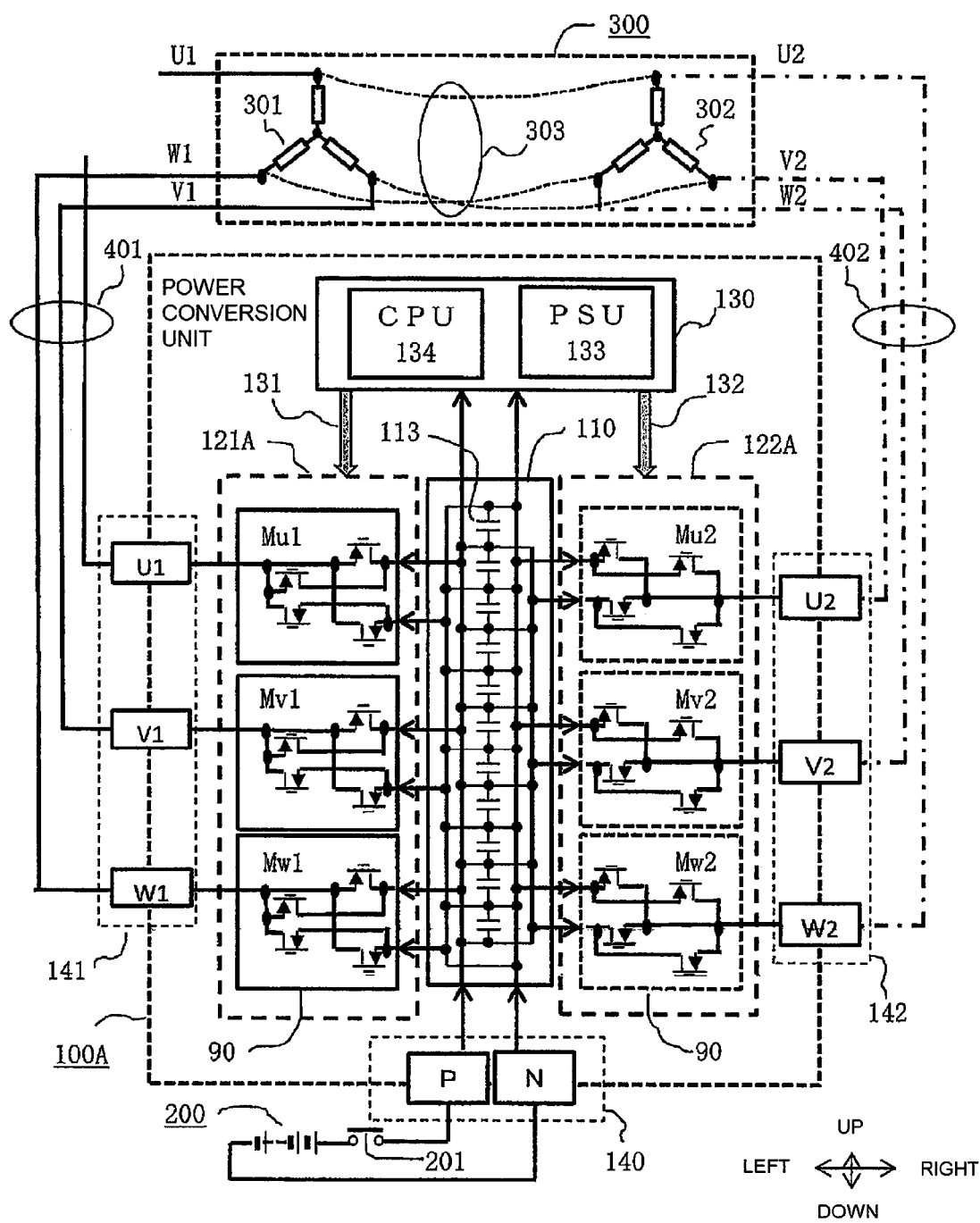
FIG. 1 is a block diagram for illustrating an entire circuit of a power conversion unit according to a first embodiment of the present invention.

Referring to FIG. 1, a configuration of a power conversion unit according to a first embodiment of the present invention is described below. FIG. 1 is a block diagram for illustrating an entire circuit thereof. In FIG. 1, a power conversion unit 100A is configured to receive power from a DC power supply 200 via a positive-side power supply terminal P and a negative-side power supply terminal N, which are provided in a DC power supply terminal block 140. A power feeding circuit therefor includes a power switch 201. In this example, the DC power supply 200 is, for example, a DC48V-compatible low-voltage battery. First AC power supply terminals 141 provided in the power conversion unit 100A are connected to a first U-phase terminal U1, a first V-phase terminal V1, and a first W-phase terminal W1 of first three phase windings 301 of a three-phase AC motor 300 via first load wirings 401. Second AC power supply terminals 142 provided in the power conversion unit 100A are connected to a second U-phase terminal U2, a second V-phase terminal V2, and a second W-phase terminal W2 of second three phase windings 302 of the second three-phase AC motor 300 via second load wirings 402.

Here, it is conceivable that the second three phase windings 302 are connected in parallel to the first three phase windings 301 by internal short-circuit lines 303, so that the three-phase AC motor 300 appears to include only the first three phase windings 301. In this case, the second load wirings 402 are omitted, and a second opening/closing module 122A provided in the power conversion unit 100A as described later is also omitted. The power conversion unit 100A includes a circuit board 110, a first opening/closing module 121A and the second opening/closing module 122A, and a control circuit unit 130. The circuit board 110 serves to connect a plurality of parallel-connected unit capacitors 113 between the positive-side power supply terminal P and the negative-side power supply terminal N. The first opening/closing module 121A and the second opening/closing module 122A each include three unit modules 90. The control circuit unit 130 serves to output a first gate signal 131 and a second gate signal 132 to the first opening/closing module 121A and the second opening/closing module 122A, respectively. The control circuit unit 130 includes a constant voltage power supply unit 133 and a microprocessor 134. The individual unit modules 90 are arranged on the right and left of the circuit board 110, and connected to the positive-side power supply terminal P and the negative-side power supply terminal N to output an AC power via internal opening/closing elements described later.

Figure 2:
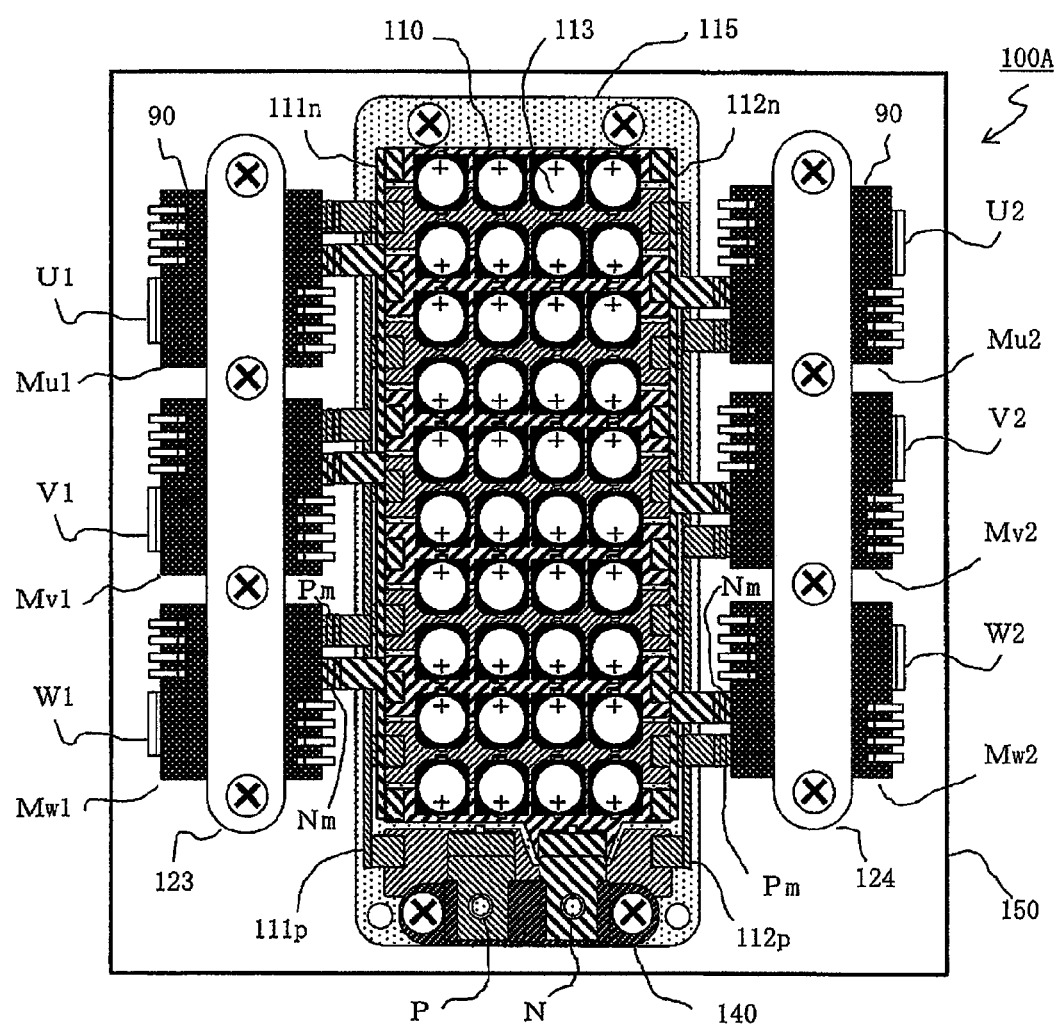
FIG. 2 is a plan view for illustrating an internal configuration of the power conversion unit of FIG. 1.
Figure 3:
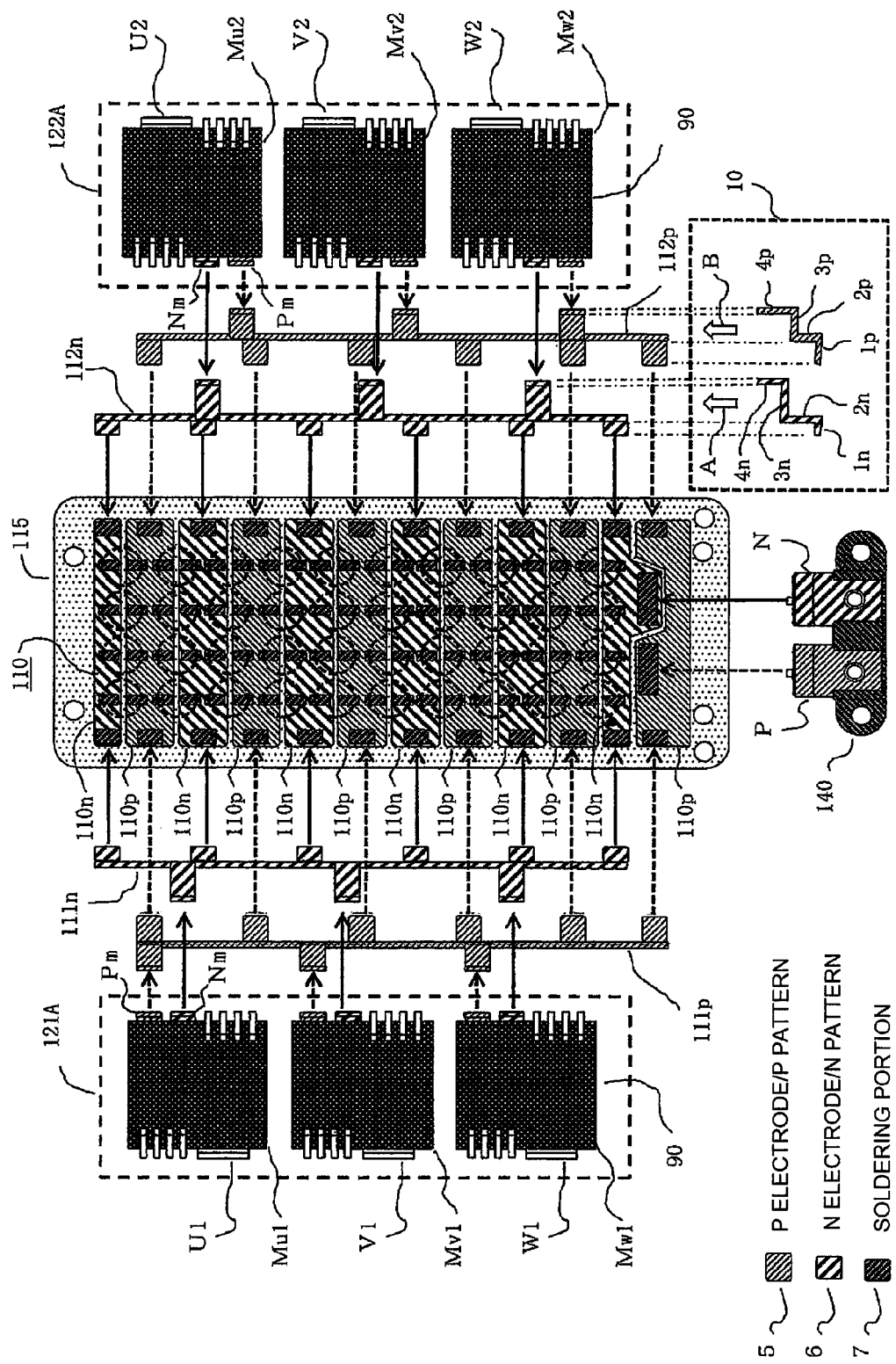
FIG. 3 is a plan view for illustrating the internal configuration of FIG. 2, from which unit capacitors are removed.
Figure 4:
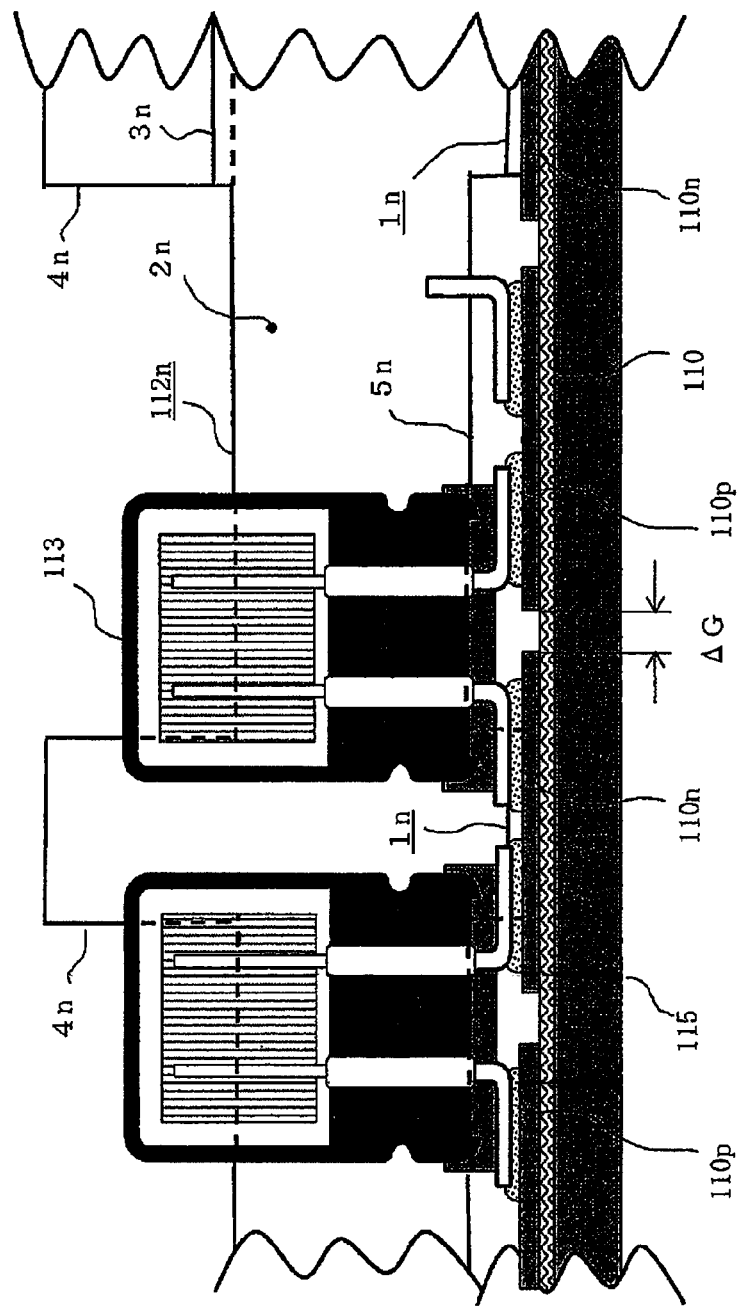
FIG. 4 is a sectional view for illustrating how to attach the individual unit capacitors in the power conversion unit of FIG. 1.
Figure 5:
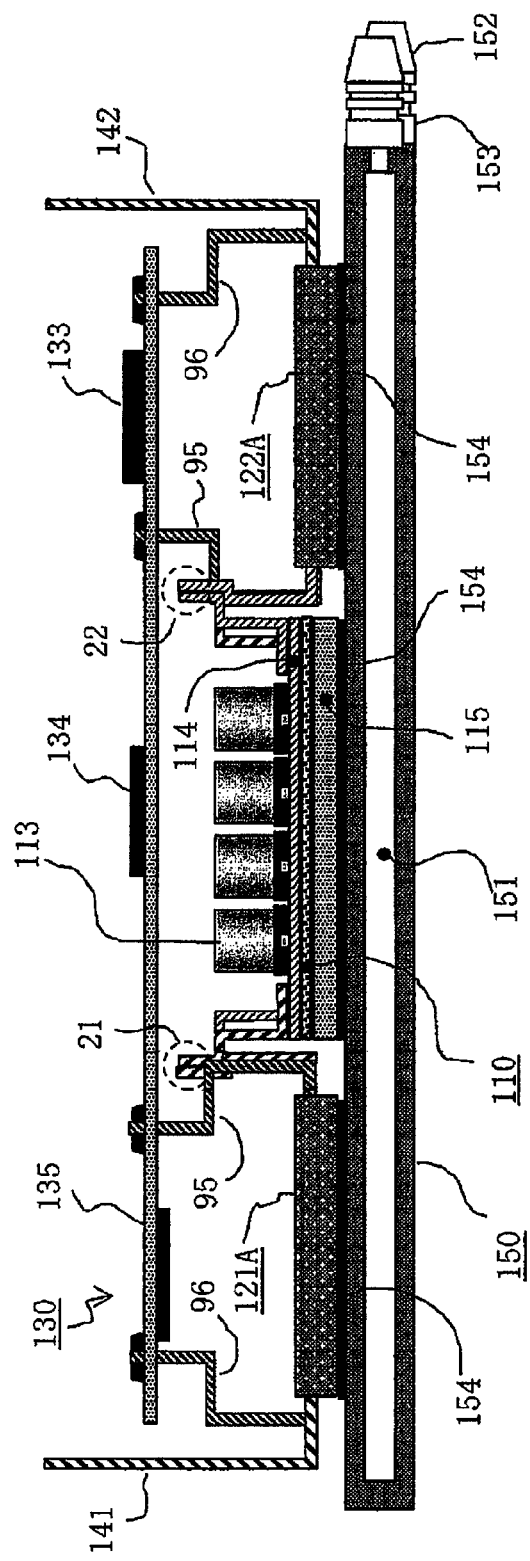
FIG. 5 is a sectional view for illustrating a whole assembly of main parts of the power conversion unit of FIG. 1.

Note that, in the following drawings, the DC power supply terminal block 140 side and the first AC power supply terminal 141 side are referred to as a lower side and a left side, respectively, merely for illustrative purposes. The present application encompasses all variants with different horizontal and vertical positions. Next, referring to FIG. 2 and FIG. 3, the configuration of the power conversion unit of FIG. 1 is described in detail. FIG. 2 is a plan view for illustrating an internal configuration thereof. FIG. 3 is a plan view for illustrating the internal configuration of the power conversion unit of FIG. 2, from which unit capacitors are removed. In FIG. 2, the circuit board 110 is screwed to a cooling plate 150 through intermediation of a heat-transfer holding plate 115 described later (FIG. 4 and FIG. 5). On the circuit board 110, forty unit capacitors 113 are mounted. In addition, a first positive-side bus bar 111p and a second positive-side bus bar 112p are arranged at right and left ends thereof to be connected to the positive-side power supply terminal P. Further, a first negative-side bus bar 111n and a second negative-side bus bar 112n are arranged at right and left ends thereof to be connected to the negative-side power supply terminal N. Regarding two sets of three unit modules 90 arranged on the right and left of the circuit board 110, the three modules of the one set each include a positive-side electrode terminal Pm to be welded to the first positive-side bus bar 111p, a negative-side electrode terminal Nm to be welded to the first negative-side bus bar 111n, and a corresponding one of AC electrode terminals AC (U1, V1, and W1). Those three terminals are fixed in pressure contact to the cooling plate 150 through use of a first retaining plate 123. The three modules of the other set each include a positive-side electrode terminal Pm to be welded to the second positive-side bus bar 112p, a negative-side electrode terminal Nm to be welded to the second negative-side bus bar 112n, and a corresponding one of AC electrode terminals AC (U2, V2, and W2). Those three terminals are fixed in pressure contact to the cooling plate 150 through use of a second retaining plate 124.

In FIG. 3, the circuit board 110 has a plurality of positive-side patterns 110p and a plurality of negative-side patterns 110n formed thereon. Those negative-side and positive-side patterns alternately extend in a horizontal direction. At right and left ends of the respective negative-side patterns 110n, solder terminal portions 1n (see cross-section as viewed from the arrow A in a box 10 at the lower right of FIG. 3) of the first negative-side bus bar 111n and the second negative-side bus bar 112n extending in the vertical direction are soldered, so that the negative-side patterns 110n are connected in parallel to one another through the first negative-side bus bar 111n and the second negative-side bus bar 112n. Likewise, at right and left ends of the respective positive-side patterns 110p, solder terminal portions 1p (see cross-section as viewed from the arrow B in the box 10 at the lower right of FIG. 3) of the first positive-side bus bar 111p and the second positive-side bus bar 112p extending in the vertical direction are soldered, so that the positive-side patterns 110p are connected in parallel to one another through the first positive-side bus bar 111p and the second positive-side bus bar 112p. Here, a lowermost one of the positive-side patterns 110*p* is soldered to the positive-side power supply terminal P fixed to the DC power supply terminal block 140. A lowermost one of the negative-side pattern 110*n* is soldered to the negative-side power supply terminal N fixed to the DC power supply terminal block 140. The unit capacitors 113 are mounted to portions encircled by the dotted line, and soldered in between one pair of adjacent positive-side pattern 110*p* and negative-side pattern 110*n*. Note that reference symbol 5 illustrated in the lower left of FIG. 3 represents a positive-side electrode or a positive-side pattern; 6, a negative-side electrode or a negative-side pattern; and 7, a soldered portion.

Further, in the box 10 at the lower right of FIG. 3, end faces of the second negative-side bus bar 112*n* and the second positive-side bus bar 112*p* are illustrated. Bus bar main bodies 2*n* and 2*p* extending in the vertical direction have, at one ends, the solder terminal portions 1*n* and 1*p* to be soldered to the negative-side patterns 110*n* and the positive-side patterns 110*p*, and have, at another ends, close connection portions 3*n* and 3*p* and welding connection portions 4*n* and 4*p*, respectively. The close connection portions 3*n* and 3*p* extend orthogonally to the bus bar main bodies 2*n* and 2*p*, respectively. The welding connection portions 4*n* and 4*p* extend further from close connection portions 3*n* and 3*p* orthogonally thereto, i.e., in parallel to the bus bar main bodies 2*n* and 2*p*, respectively. With this configuration, the positive-side electrode terminals Pm of the three unit modules 90 that form the first opening/closing module 121A are weldable in contact to the welding connection portions 4*p* of the first positive-side bus bar 111*p*. The negative-side electrode terminals Nm thereof are weldable in contact to the welding connection portions 4*n* of the first negative-side bus bar 111*n*. Likewise, the positive-side electrode terminals Pm of the three unit modules 90 that form the second opening/closing module 122A are weldable in contact to the welding connection portions 4*p* of the second positive-side bus bar 112*p*. The negative-side electrode terminals Nm thereof are weldable in contact to the welding connection portions 4*n* of the second negative-side bus bar 112*n*.

In this embodiment, four unit capacitors 113 are connected in parallel in one capacitor row, and ten capacitor rows are arranged as a whole. Of those, two capacitor rows are arranged adjacently to side portions of each pair of right and left unit modules 90 (in total, six capacitor rows), one capacitor row is arranged in between the upper module and the middle module, and in between the middle module and the lower module (i.e., between Mu1 and Mv1 and between Mv1 and Mw1, or between Mu2 and Mv2 and between Mv2 and Mw2) (in total, two capacitor rows), and one capacitor row is arranged at each of the uppermost and lowermost portions (in total, two capacitor rows). Here, the two outermost capacitor rows correspond to one intermediate capacitor row arranged in between the upper and lower unit modules 90, and hence the number of parallel-connected unit capacitors 113 in one row may be reduced to two or three in consideration of an overall balance. Further, in the configuration of FIG. 2 and FIG. 3, the first negative-side bus bar 111*n* and the second negative-side bus bar 112*n* are arranged inside the first positive-side bus bar 111*p* and the second positive-side bus bar 112*p*, but can be arranged outside the first positive-side bus bar 111*p* and the second positive-side bus bar 112*p*. The bus bars are made of highly conductive copper or copper alloy.

Next, referring to FIG. 4 and FIG. 5, the configuration of the power conversion unit of FIG. 1 is described in detail. FIG. 4 is a sectional view for illustrating how to attach the individual unit capacitors thereof. FIG. 5 is a sectional view for illustrating a whole assembly of main parts thereof. In FIG. 4, the individual unit capacitors 113 are soldered in between corresponding ones of the plurality of positive-side patterns 110*p* and the plurality of negative-side patterns 110*n*, which are formed on a front surface of the resin-made circuit board 110. In the illustrated example, it is assumed that the four unit capacitors 113 are connected in a front-to-back direction of the drawing sheet. Further, the copper-made or copper alloy-made heat-transfer holding plate 115 is attached to a rear surface of the circuit board 110, to thereby keep the numerous unit capacitors 113 at the same temperature. In addition, the heat-transfer holding plate 115 has the same linear expansion coefficient as the bus bars so as to prevent thermal deformation of the circuit board 110. Note that the second negative-side bus bar 112*n* having the solder terminal portions 1*n* passes over upper surface portions of the positive-side patterns 110*p* owing to jumper portions 5*n*, and thereby serves as a jumper line.

In FIG. 5, the circuit board 110 integrated with the heat-transfer holding plate 115, and the first opening/closing module 121A and the second opening/closing module 122A are fixed in pressure contact to the cooling plate 150 through a heat-transfer grease 154. The cooling plate 150 incorporates therein a cooling water path 151 having an inlet 152 and an outlet 153 for cooling water. A control board 135 that forms the control circuit unit 130 is fixed to the cooling plate 150 through a fixing member (not shown). On the control board 135, the microprocessor 134 is mounted, which receives a stabilized control voltage (e.g., DC5V) from the constant voltage power supply unit 133. Further, the positive-side electrode terminals Pm and the negative-side electrode terminals Nm of the unit modules 90 that form the first opening/closing module 121A are joined by welding to the welding connection portions 4*p* of the first positive-side bus bar 111*p*, and to the welding connection portions 4*n* of the first negative-side bus bar 111*n* at a welding portion 21; the positive-side electrode terminals Pm and the negative-side electrode terminals Nm of the unit modules 90 that form the second opening/closing module 122A are joined by welding to the welding connection portions 4*p* of the second positive-side bus bar 112*p*, and to the welding connection portions 4*n* of the second negative-side bus bar 112*n* at a welding portion 22 (see FIG. 2 and FIG. 3).

Figure 6A:
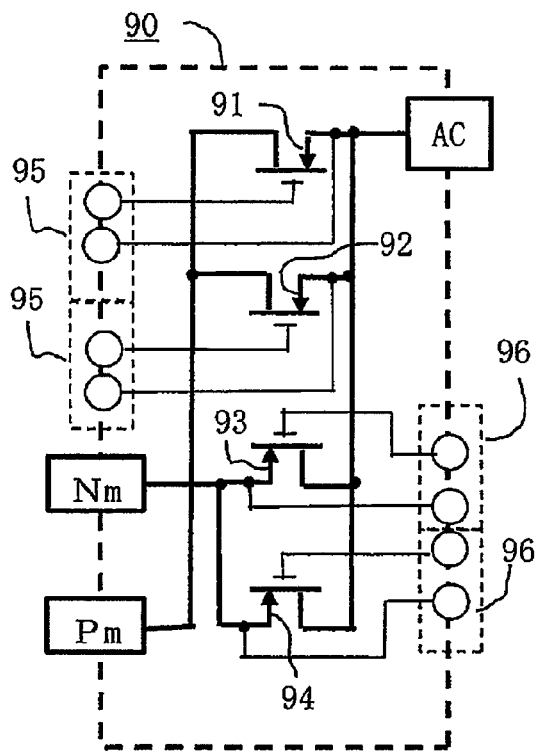
FIG. 6A is a diagram for illustrating an internal configuration of a unit module of the power conversion unit of FIG. 1.
Figure 6B:
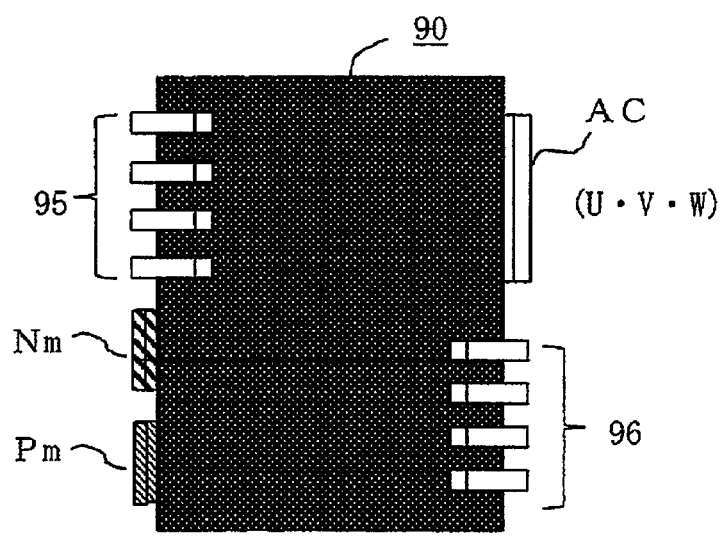
FIG. 6B is an external view for illustrating a terminal layout of the unit module of the power conversion unit of FIG. 1.

Further, the AC electrode terminals AC of the unit modules 90 are connected to the first AC power supply terminals 141 (U1, V1, and W1) and the second AC power supply terminals 142 (U2, V2, and W2). Upstream gate driving terminals 95 and downstream gate driving terminals 96 described later (FIG. 6A and FIG. 6B), are directly connected by soldering to the control board 135. Next, referring to FIG. 6A and FIG. 6B, the configuration of the power conversion unit of FIG. 1 is described in detail. FIG. 6A is a diagram for illustrating an internal configuration of one unit module of the power conversion unit of FIG. 1. FIG. 6B is an external view for illustrating a terminal layout of the unit module of the power conversion unit of FIG. 1. In FIG. 6A, the unit module 90A mainly includes a parallel circuit of first and second upstream opening/closing elements 91 and 92, which are connected between the positive-side electrode terminal Pm and the AC electrode terminal AC, and a parallel circuit of first and second downstream opening/closing elements 93 and 94, which are connected between the negative-side electrode terminal Nm and the AC electrode terminal AC. An N-channel type field effect transistor is used for each opening/closing element. A first or second gate signal (see FIG. 1) for driving to close the first and second upstream opening/closing elements 91 and 92 is provided to the pair of upstream gate drive terminals 95 and 95. In addition, a first or second gate signal (see FIG. 1) for driving to close the first and second downstream opening/closing elements 93 and 94 is provided to the pair of downstream gate drive terminals 96 and 96.

In FIG. 6B, the unit module 90A is subjected to resin sealing and integrated. The positive-side electrode terminal Pm, the negative-side electrode terminal Nm, and the upstream gate drive terminal 95 are provided on one side of right and left sides on the opposite positions. The AC electrode terminal AC and the downstream gate drive terminal 96 are provided on another side. As illustrated in FIG. 2 and FIG. 3, the positive-side electrode terminals Pm and the negative-side electrode terminals Nm are connected by welding to the welding connection portions 4p and 4n of the first positive-side bus bar 111p and the second positive-side bus bar 112p, and of the first negative-side bus bar 111n and the second negative-side bus bar 112n, respectively. As illustrated in FIG. 1 and FIG. 5, the AC electrode terminal AC serves as a corresponding one of a U1-phase terminal, a V1-phase terminal, and a W1-phase terminal of the first AC power supply terminal 141, and a U2-phase terminal, a V2-phase terminal, and a W2-phase terminal of the second AC power supply terminal 142. Moreover, as illustrated in FIG. 5, the upstream gate driving terminals 95 and the downstream gate driving terminals 96 each serve as a connection pin for connection to the control board 135.

Figure 7:
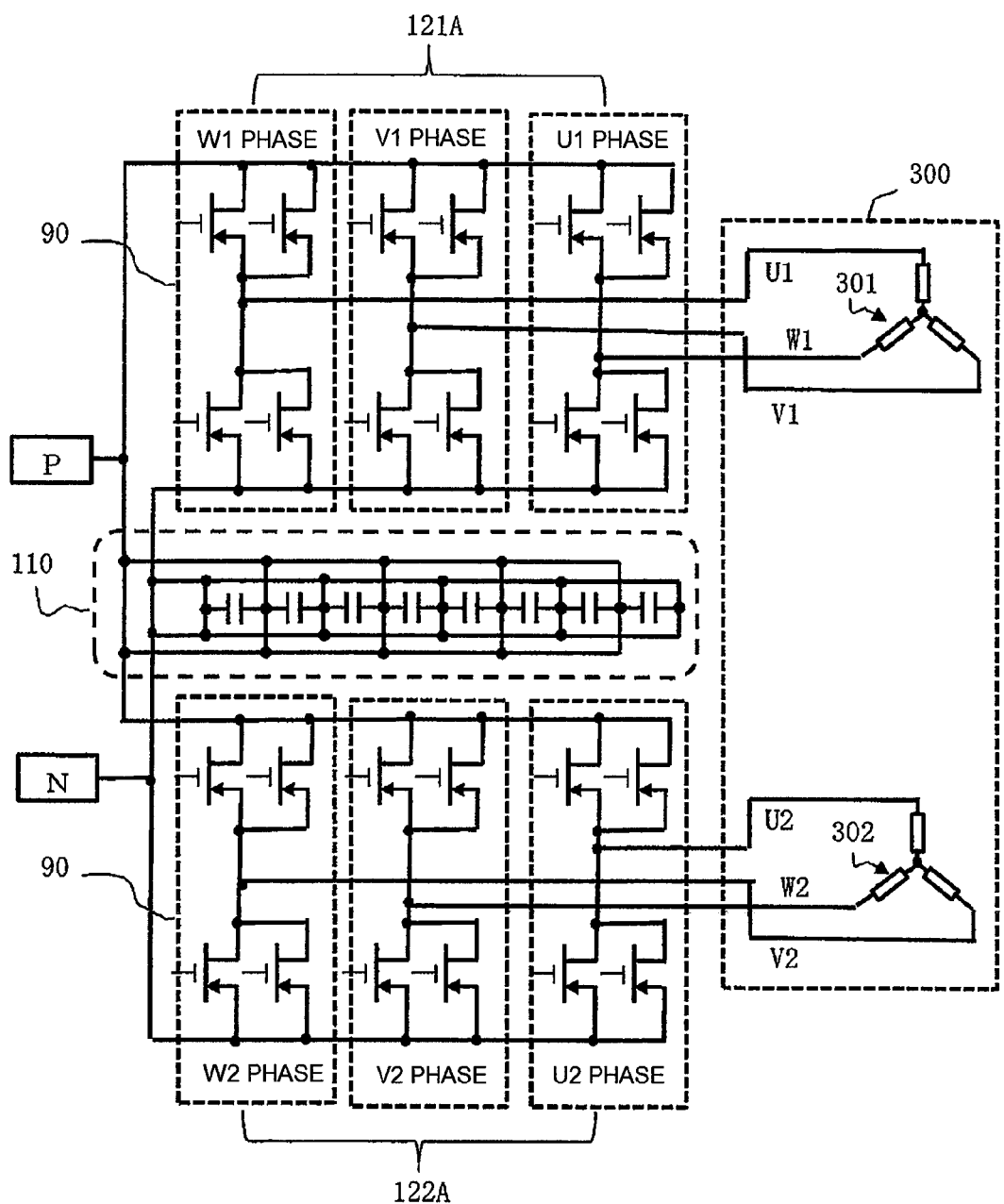
FIG. 7 is a diagram for illustrating the configuration of a power circuit of the power conversion unit of FIG. 1.

Next, referring to FIG. 7, the configuration of the power conversion unit of FIG. 1 is described in detail. FIG. 7 is a diagram for illustrating the configuration of a power circuit thereof. In FIG. 7, the three unit modules 90 connected to the first three phase windings 301 of the three-phase AC motor 300 form the first opening/closing module 121A, and the three unit modules 90 connected to the second three phase windings 302 form the second opening/closing module 122A. Further, the circuit board 110 is arranged between the positive-side power supply terminal P and the negative-side power supply terminal N which receive a DC power supply voltage. On the circuit board 110, the numerous unit capacitors 113 are connected in parallel to form a power smoothing capacitor. The six unit modules 90 form a half-bridge circuit by means of two upper and lower parallel-connected transistors. Those unit modules receive a voltage obtained by smoothing the DC power supply voltage via the circuit board 110, so that the three unit modules collectively output a three-phase AC power. Here, each unit module 90 is assumed to have such a configuration that AC output terminals of a two-phase bridge circuit are short-circuited inside or just outside the module. Thus, when a low-output three-phase AC motor is employed, a half-bridge circuit can be used, which is configured by separate upper and lower transistors, not the parallel-connected transistors.

(2) Detailed Description of Operation

A detailed description is given below of operations of the power conversion unit 100A according to the first embodiment of the present invention, which is configured as illustrated in FIG. 1 to FIG. 7. First, in FIG. 1 (FIG. 1 is a block diagram of the entire circuit, when the power switch 201 is closed, a DC voltage from the DC power supply 200 is applied between the positive-side power supply terminal P and the negative-side power supply terminal N. Then, the unit modules 90 that form the half-bridge circuit receive a DC voltage smoothed by the numerous parallel-connected unit capacitors 113 mounted on the circuit board 110, via the negative and positive bus bars. At the same time, the constant voltage power supply unit 133 in the control circuit unit 130 generates a predetermined stabilized voltage, and the microprocessor 134 starts operating. The microprocessor 134 intermittently control the upstream and downstream opening/closing elements of the unit modules 90 to allow the three unit modules to produce one three-phase AC voltage of a pseudo sine waveform. In this case, a frequency of the three-phase AC voltage can be set variable in proportion to a target motor rotation speed.

The microprocessor 134 also serves to detect a rotational position of a rotor through use of a rotation sensor therefor to thereby determine whether to advance or retard a phase of a rotating magnetic field generated by the three-phase windings with respect to a rotational phase of the rotor, so as to selectively allow a power running operation or a braking operation executed through regenerative charging. The power smoothing capacitor configured by the numerous unit capacitors 113 serves to smooth voltage fluctuation caused by a parasitic impedance of power supply lines, in accordance with the intermittent inflow/outflow of a load current or a regenerative current to/from the respective unit modules 90. An effect of suppressing voltage fluctuation is enhanced as an amount of electrostatic energy storable by the capacitor is increased. The amount of electrostatic energy is proportional to the product of the square of a charging voltage and a capacitance. Considering that a motor-driving DC voltage is generally 300 V to 400 V in electric vehicles, a DC48V-compatible in-vehicle battery is required in order to obtain a driving voltage lower than DC60V that causes no electric shock. Thus, in order to store the same amount of electrostatic energy, the capacitor is required to have a capacitance 39 times higher than the general one, which is derived from 300/48=6.25 and 6.25×6.25=39.

In this regard, when a withstand voltage is decreased, the capacitor can be downsized and ensure large capacitance; however, in actual use, it is required to parallel-connect a large number of capacitors. One known capacitor that is suitable for such an application is a dielectric polymer aluminum solid electrolytic capacitor. However, when a large number of capacitors are connected in parallel, there is a risk of causing fluctuations in capacitance of each capacitor and equivalent series resistance and thus causing variations in degree of temperature rise, with the result that a service life of some capacitor(s) may be considerably reduced. One approach to avoiding such a circumstance is to reduce a parasitic impedance of the power supply wirings, another approach is to parallel-connect a large number of small-capacitance capacitors rather than a small number of large-capacitance capacitors so as to reduce a ripple current per capacitor, still another approach is to provide a heat-transfer mechanism that allows the unit capacitors to be kept at the same temperature, and further another approach is to select, by sorting, a product that involves smaller fluctuations in capacitance of the capacitors.

Next, in FIG. 2 (FIG. 2 is an internal configuration view), the four unit capacitors 113 are connected in parallel in the horizontal direction, and the ten capacitor rows are arranged in the vertical direction. Of those, the second and third capacitor rows are arranged closely adjacent to the upper unit modules 90, and the fifth and sixth capacitor rows and the eighth and ninth capacitor rows are similarly arranged adjacent to the middle unit modules 90 and the lower unit modules 90, respectively. Further, the fourth capacitor row is arranged in between the upper and middle unit modules 90, and the seventh capacitor row is arranged in between the middle and lower unit modules 90. Note that the unit capacitors 113 of the intermediate capacitor rows, i.e., the fourth capacitor row and those of the seventh capacitor row receive a U-phase current and a V-phase current, and a V-phase current and a W-phase current, respectively. However, those phase currents are not allowed to reach a maximum value at the same time; the currents flow in a distributed manner not to apply a large load to each module. Further, the first capacitor row and the tenth capacitor row are outermost ones arranged at an upper portion of the upper unit modules 90 and a lower portion of the lower unit modules 90, respectively. In this example, the number of capacitors corresponding to the U phase and the W phase is substantially equal to the number of capacitors corresponding to the V phase.

Next, in FIG. 3 and FIG. 4 (FIG. 3 is a plan view for illustrating the circuit board from which the unit capacitors are removed and FIG. 4 is a sectional view for illustrating how to attach the individual unit capacitors), the positive-side terminals Pm and the negative-side terminals Nm of the unit modules 90 that receive large current are directly connected to the positive-side power supply terminal P and the negative-side power supply terminal N via the first positive-side bus bar 111$p$ and the second positive-side bus bar 112$p$, and the first negative-side bus bar 111$n$ and the second negative-side bus bar 112$n$, all of which are made of copper or copper alloy with a low resistance, to thereby suppress voltage drop caused by the power supply lines. In addition, the circuit board 110 is covered by the wide and short positive-side patterns 110$p$ and negative-side patterns 110$n$, so that substantially an entire surface thereof forms a power supply pattern, except portions in a slight gap AG between each positive-side pattern 110$p$ and each negative-side pattern 110$n$. Further, the unit capacitors 113 as surface-mounted components are soldered in between the positive-side patterns 110$p$ and the negative-side patterns 110$n$ to thereby achieve short-distance connection to the positive and negative bus bars and suppress a voltage drop caused by a ripple current.

Next, in FIG. 5, FIG. 6A, and FIG. 6B (FIG. 5 is a sectional view for illustrating an entire assembly of main parts, FIG. 6A is a view for illustrating an internal configuration of the unit module, and FIG. 6B is a view for illustrating a terminal layout of the unit module), the circuit board 110 integrated with the heat-transfer holding plate 115, and the first opening/closing module 121A and the second opening/closing module 122A are fixed in pressure contact to the cooling plate 150 via the heat-transfer grease 154, and the cooling plate 150 incorporates therein the cooling water path 151 having the inlet 152 and the outlet 153 for cooling water, and hence heat generating portions are uniformly cooled, and connection portions for signal transmission between the control board 135 and the first opening/closing module 121A and the second opening/closing module 122A, and connection portions for power supply between the circuit board 110 and those modules are also integrally formed without any contact portions. Here, each unit module 90 has a symmetrical terminal layout. That is, the unit module 90 can be attached to the right and left sides of the circuit board 110. In this case, the positive-side electrode terminal Pm and the negative-side electrode terminal Nm of the unit module 90 on the right side are diagonally symmetric to those of the unit module 90 on the left side as viewed in the vertical direction. With this configuration, the unit modules 90 opposite to different capacitor rows supply currents to capacitors in a distributed manner.

Next, in FIG. 7 (FIG. 7 is a diagram for illustrating a power circuit configuration), when the unit modules 90 in the first opening/closing module 121A and the second opening/closing module 122A intermittently apply load current to the first three phase windings 301 and the second three phase windings 302 to cause a pulsating current to flow therethrough, a pulsating voltage fluctuates due to a parasitic impedance of the power supply wirings from the DC power supply 200 to the positive-side terminal Pm and the negative-side terminal Nm of each unit module 90, and an internal resistance of the DC power supply 200. In order to compensate for the voltage fluctuations, the power smoothing capacitor provided close to the unit modules 90 allows the pulsating current to flow therein or therefrom. In the first embodiment, the first opening/closing module 121A and the second opening/closing module 122A have the same phase arrangement, and hence, when a U1-phase load current having a pseudo sine waveform reaches the maximum value Im, a U2-phase load current also reaches the maximum value Im. Thus, the capacitor rows (four rows in total, i.e., two adjacently arranged rows, one intermediate row, and one outer row) corresponding to the U1 phase and the U2 phase are required to suppress a pulsating current corresponding to a load current that is twice the maximum current Im, at the same time.

Figure 8A:
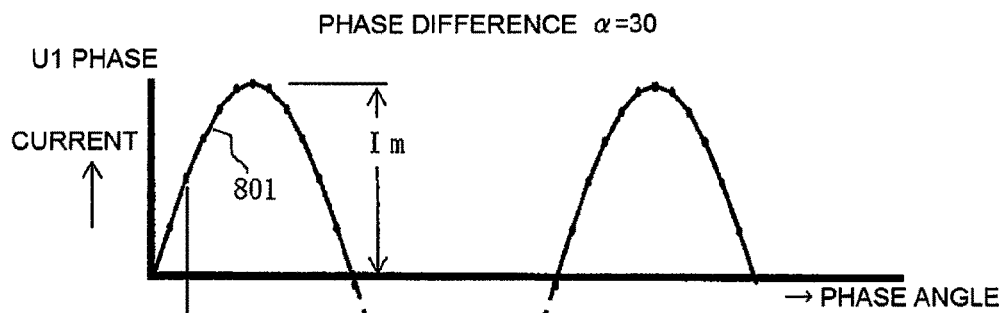
FIGS. 8A-8C are explanatory graphs for showing a characteristic curve of an added current waveform in the power conversion unit of FIG. 1.
Figure 8B:
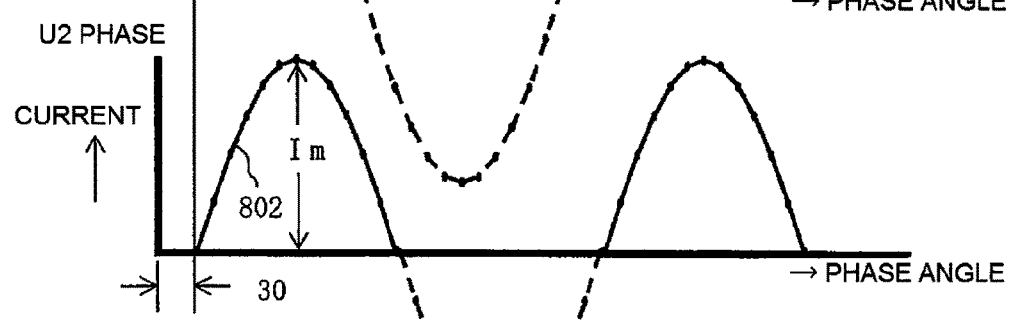

Here, assuming that a phase difference of, for example, about 30 degrees is preset as a phase difference α between a first three-phase voltage with respect to the first three phase windings 301 and a second three-phase voltage with respect to the second three phase windings 302, it can be avoided that the maximum current Im is supplied to the capacitors at the same time, so that the capacitors are only required to suppress a pulsating current corresponding to a load current that is 1.93 (sin 105+sin 75=1.93) times the maximum current Im. A description thereof is given below with reference to FIG. 8. FIG. 8 are explanatory graphs for showing a characteristic curve of an added current waveform. In FIG. 8(A), a U1-phase basic waveform 801 is a sine waveform with a peak value Im, of a load current flowing into the U1-phase unit module 90. In actuality, however, the illustrated wave is a multistage pseudo sine wave, which is superimposed by waves of high-frequency ripple currents caused by intermittent operations of the opening/closing elements in the unit module 90. In FIG. 8(B), a U2-phase basic waveform 802 is a sine waveform with the peak current Im, of a load current flowing into the U2-phase unit module 90. In this case, the phase of the waveform 802 is delayed by 30 degrees from that of the U1-phase basic waveform 801. Further, a pseudo sine wave of the U2-phase basic waveform 802 is similarly imposed by a high-frequency ripple current caused by intermittent operations of the opening/closing elements in the unit module 90.

Figure 8C:
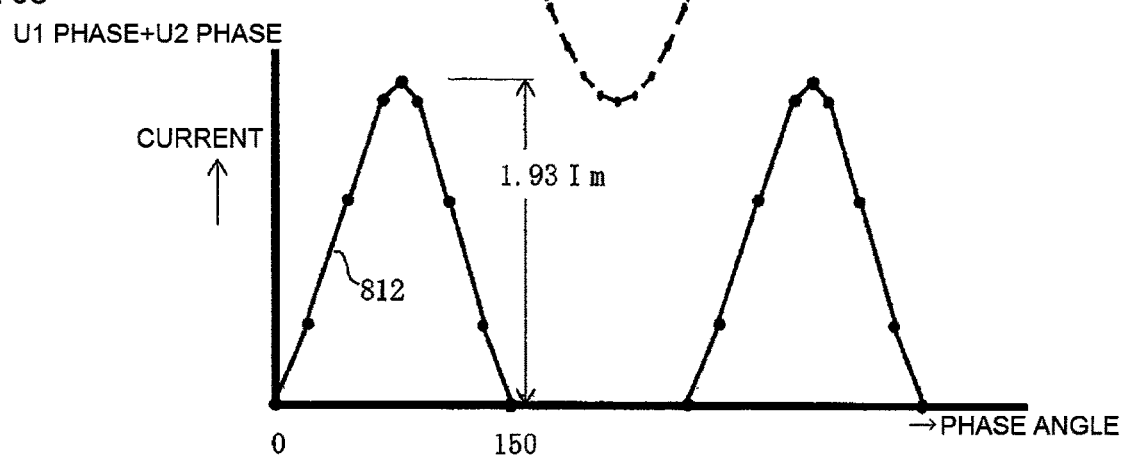

In FIG. 8(C), a (U1 phase+delayed U2 phase) added waveform 812 is a current waveform obtained by adding an instantaneous value of the U1-phase basic waveform 801 and that of the U2-phase basic waveform 802. The maximum value thereof is 1.93 Im at a phase angle of 105 degrees. Here, the peak value Im of the sine wave varies depending on a rotational load torque applied to the three-phase AC motor 300. In addition, as the peak value Im increases along with an increase in rotational load torque, an amplitude of the high-frequency ripple current imposed is accordingly increased. Therefore, the peak current Im can be used as an indication of the amplitude of the ripple current. Moreover, the power smoothing capacitor serves to suppress a high-frequency ripple voltage obtained by multiplying the high-frequency ripple current by a parasitic impedance of power supply lines. Thus, when the peak value Im of the basic wave as the indication increases and the amplitude of the ripple current then increases, the amplitude of the ripple voltage increases as well.

Accordingly, assuming that the unit capacitors 113 of the four intermediate capacitor rows between the right and left upper unit modules 90 are of one upper capacitor group, it is desired to avoid such a situation that the currents in the pair of right and left unit modules 90 reach their peak values at the same time. In this regard, the configuration of FIG. 8(C) is not highly effective in reducing a peak value of a composite waveform, and is less effective in reducing a ripple current. How to improve the above-mentioned configuration is described in detail in a second embodiment of the present invention.

(3) Main Points and Characteristics of First Embodiment

As is apparent from the description described above, the power conversion unit according to the first embodiment includes: a power smoothing capacitor connected to a DC power supply 200; and a plurality of unit modules 90, which are connected in series to three phase windings of a three-phase AC motor 300 including first three phase windings 301 or the first three phase windings 301 and second three phase windings 302, and are configured to intermittently supply load current; and a control circuit unit 130 configured to execute opening/closing control of the plurality of unit modules 90 such that one type of three-phase AC voltage is applied to any one of the first three phase windings 301, and the first three phase windings 301 and the second three phase windings 302, or two types of three-phase AC voltages having a predetermined phase difference therebetween are applied to the first three phase windings 301 and the second three phase windings 302, and such that the three-phase AC voltages each have a relation having a variable frequency the same frequency, wherein the power smoothing capacitor is configured by an assembly of a plurality of unit capacitors being conductive polymer solid aluminum electrolytic capacitors or conductive polymer hybrid aluminum electrolytic capacitors, the plurality of unit capacitors 113 being connected in parallel through use of a circuit board 110, wherein, on the circuit board 110, a plurality of positive-side patterns 110*p* and a plurality of negative-side patterns 110*n*, each extending in a horizontal direction, are alternately arrayed in a vertical direction, such that corresponding ones of the plurality of unit capacitors 113 are soldered in between adjacent ones of the positive-side patterns 110*p* and the negative-side patterns 110*n*, a lowermost one of the positive-side patterns 110*p* is connected to a positive-side power supply terminal P, and a lowermost one of the negative-side patterns 110*n* is connected to a negative-side power supply terminal N.

Right ends of the plurality of positive-side patterns 110*p* and left ends thereof are each connected to one another via a corresponding one of a copper-made or copper-alloy-made first positive-side bus bar 111*p* and a copper-made or copper-alloy-made second positive-side bus bar 112*p*, wherein right ends of the plurality of negative-side patterns 110*n* and left ends thereof are each connected to one another via a corresponding one of a copper-made or copper-alloy-made first negative-side bus bar 111*n* and a copper-made or copper-alloy-made second negative-side bus bar 112*n*, wherein the first positive-side bus bar 111*p* and the first negative-side bus bar 111*n* are configured to extend in parallel in the vertical direction, and are connected to corresponding ones of positive-side electrode terminals Pm and negative-side electrode terminals Nm of three unit modules 90 that form a first opening/closing module 121A out of the plurality of unit modules 90, and AC electrode terminals AC provided to the three unit modules are connected to the first three phase windings 301, and wherein the second positive-side bus bar 112*p* and the second negative-side bus bar 112*n* are configured to extend in parallel in the vertical direction, and are connected, when the second three phase windings 302 are provided, to corresponding ones of positive-side electrode terminals Pm and negative-side electrode terminals Nm of three unit modules 90 that form a second opening/closing module 122A out of the plurality of unit modules 90, and the AC electrode terminals AC provided to the three unit modules are connected to the second three phase windings 302.

Between the positive-side patterns 110*p* and the negative-side patterns 110*n* on the circuit board 110, the capacitor rows each including three to five of the unit capacitors 113, which are connected in parallel, are formed, in the capacitor rows, two each, six in total of the capacitor rows are adjacently arranged on right sides or left sides of each three unit modules 90, including an upper unit module, an intermediate unit module 90, and a lower unit module; one each of the ten capacitor rows is arranged in between the upper unit module and the intermediate unit module and in between the lower unit module and the intermediate unit module; and one each of the capacitor rows is additionally arranged above an uppermost one of the capacitor rows and below a lowermost one of the capacitor rows, to thereby form total 10 rows of the capacitor rows.

As described above, the power conversion unit achieves the following feature in relation to claim 2 of the present invention. The three or five unit capacitors are connected in parallel per row on the circuit board used to form the power smoothing capacitor. In addition, every two unit capacitors arranged adjacent to the U-phase, V-phase, and W-phase unit modules are configured to mainly operate in corporation with the intermediate row or outer capacitor rows with respect to the unit modules. Here, load currents flowing in the U-phase and V-phase unit modules or the V-phase and W-phase unit modules have a phase difference of 120 degrees, and thus do not reach the maximum value at the same time. Therefore, the capacitor row arranged in between the U phase and the V phase or between the V phase and the W phase, acts on those two phases with some delay to thereby achieve a function substantially equivalent to having one additional capacitor row adjacent to the two phases, and thus reduce a total number of capacitor rows. Further, the capacitor row arranged at outer positions of each of the U-phase unit module and the W-phase unit module can maintain a smoothing function equivalent to that of each capacitor row corresponding to the V phase even when the number of capacitors per row is reduced. This effect holds true in the second embodiment.

The circuit board 110 is an insulating substrate having a front surface to which a surface conductive layer 114 is adhered to form the plurality of positive-side patterns 110*p* and the plurality of negative-side patterns 110*n*, and a copper-made or copper-alloy-made heat-transfer holding plate 115 is adhered to a rear surface of the insulating substrate. As described above, the power conversion unit achieves the following feature in relation to claim 3 of the present invention. The copper-made or copper alloy-made heat-transfer holding plate is provided on the rear surface of the circuit board that forms the power smoothing capacitor. Hence, even when the plurality of unit capacitors vary in power consumption, the heat-transfer holding plate ensures uniform power consumption. In addition, each bus bar and the heat-transfer holding plate have the same linear expansion coefficient, to thereby prevent the circuit board from being thermally curved or deformed. This effect holds true in the second embodiment.

Each of the unit modules 90 forms a half bridge circuit of a square form, the half bridge circuit including at least one of a first upstream opening/closing element 91 and a second upstream opening/closing element 92 connected to the positive-side electrode terminal Pm at least one of a first downstream opening/closing element 93 and a second downstream opening/closing element 94 connected to the negative-side electrode terminal Nm, upstream gate driving terminals 95 provided for the first upstream opening/closing element 91 and the second upstream opening/closing element 92, downstream gate driving terminals 96 provided for the first downstream opening/closing element 93 and the second downstream opening/closing element 94, and the AC electrode terminal AC, which is provided at a node between the first and second upstream opening/closing elements 91, 92 and the first and second downstream opening/closing elements 93, 94, wherein the positive-side electrode terminal Pm and the negative-side electrode terminal Nm are arranged locally on one side of one pair of sides of the square form, and the AC electrode terminal AC is locally arranged on another side of the one pair of sides of the square form at a position diagonal to the positive-side electrode terminal Pm and the negative-side electrode terminal Nm, and wherein the upstream gate driving terminals 95 and the downstream gate driving terminals 96 are arranged next to the positive-side electrode terminal Pm and the negative-side electrode terminal Nm, or the AC electrode terminal AC on the one side or the another side of the one pair of sides of the square form.

As described above, relating to claim 4 of the present invention, the positive-side electrode terminal Pm and the negative-side electrode terminal Nm are arranged in a biased manner on one side of the unit module having a square shape. Thus, when the same unit modules are arranged on the right and left sides of the circuit board being an aggregate of the unit capacitors, the positive-side electrode terminal Pm and the negative-side electrode terminal Nm of one unit module are provided on the upper or lower sides of the positive-side electrode terminal Pm and the negative-side electrode terminal Nm of another unit module in crisscross arrangement, so as to face a unit capacitor group including unit capacitors in a different group area. Thus, the second embodiment has a characteristic in which an effective capacitor capacity can be increased by arranging the positive-side electrode terminal Pm and the negative-side electrode terminal Nm so as to face a wide-area unit capacitor group as compared to a case in which the positive-side electrode terminal Pm and the negative-side electrode terminal Nm of the opening/closing module are arranged in an intermediate portion of the square. This also applies to the third embodiment.

A power conversion unit according to claim 1 or 4, wherein the first positive-side bus bar 111p and the second positive-side bus bar 112p are each formed by bending sequentially at a right angle so as to have a plurality of solder terminal portions 1p to be soldered to the left ends and the right ends of the positive-side patterns 110p of the circuit board 110, one bus bar main body 2p extending vertically, a plurality of close connection portions 3p, and positive-side welding connection portions 4p,
wherein the positive-side welding connection portions 4p each form a planar portion orthogonal to the circuit board 110, which serves as a welding joint surface that is brought into contact with the positive-side electrode terminals Pm of the unit modules 90, wherein the first negative-side bus bar 111n and the second negative-side bus bar 112n are each formed by bending sequentially at a right angle a plurality of solder terminal portions 1n to be soldered to the right ends and the left ends of the negative-side patterns 110n of the circuit board 110, one bus bar main body 2n extending vertically, a plurality of close connection portions 3n, and negative-side welding connection portions 4n, and wherein the negative-side welding connection portions 4n each form planar portions orthogonal to the circuit board 110, which serve as weld joint surfaces that is configured to abut with the negative-side electrode terminals Nm of the unit modules 90.

As described above, the power conversion unit achieves the following feature in relation to claim 5 of the present invention. The pair of positive and negative bus bars arranged on the right and left sides of the circuit board each include the solder terminal portions, the bus bar main bodies, the close connection portions, and the welding connection portions, which are formed by successively bending the bus bars at right angles in opposite directions. Each welding connection portion includes a planar portion orthogonal to the circuit board; the planar portion is connected by welding to a corresponding one of the positive-side electrode terminal and the negative-side electrode terminal of a corresponding unit module. Accordingly, the circuit board and each unit module can be installed at a short distance, and their welding surfaces can be brought into contact with each other by means of each close connection portion of each bus bar. This effect holds true in the second embodiment.

Second Embodiment (1) Detailed Description of Configuration and Operation

Figure 9:
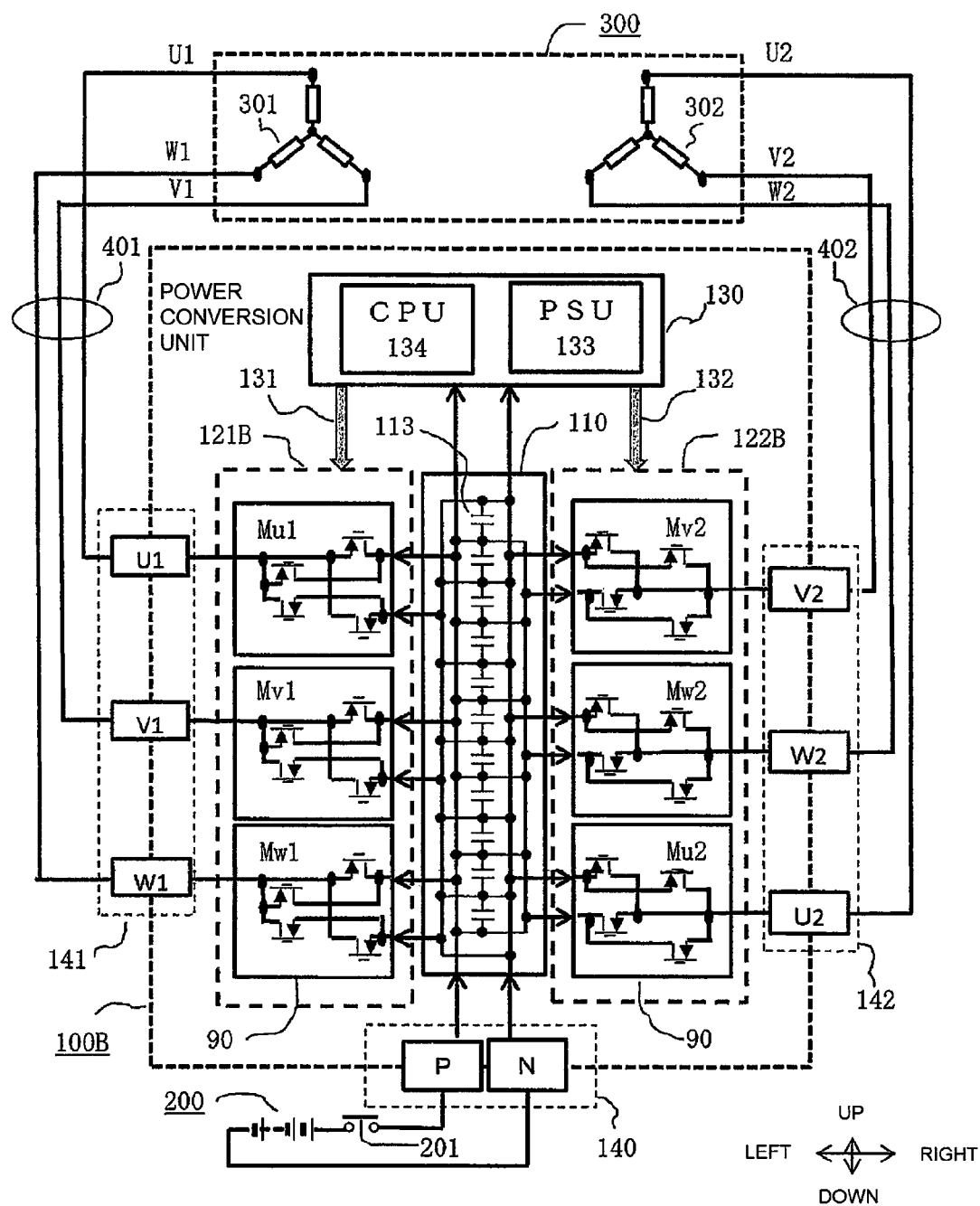
FIG. 9 is a block diagram for illustrating an entire circuit of a power conversion unit according to a second embodiment of the present invention.

Referring to FIG. 9, a detailed description is given below of a configuration of a power conversion unit according to the second embodiment of the present invention, focusing on differences from the power conversion unit of FIG. 1. FIG. 9 is a block diagram for illustrating an entire circuit thereof. In the drawings, identical or equivalent components are denoted by identical reference symbols, and the components of the first and second embodiments are distinguished by the last capital letter of the reference symbol like the power conversion unit 100A and a power conversion unit 100B. In FIG. 9, a main difference from the configuration of FIG. 1 is that the three-phase AC motor 300 of FIG. 9 includes separate first three phase windings 301 and second three phase windings 302, and the power conversion unit 100B includes a first opening/closing module 121B and a second opening/closing module 122B. Regarding the other components, i.e., the circuit board 110 having formed thereon the plurality of parallel-connected unit capacitors 113 to thereby form a power smoothing capacitor, the six unit modules 90 that form the first opening/closing module 121B and the second opening/closing module 122B, and the control circuit unit 130, those components are configured similarly to the configuration of FIG. 1, except that the phases are shifted by one, specifically, the phase arrangement order is U1, V1, and W1 in the first opening/closing module 121B, but is V2, W2, and U2 in the second opening/closing module 122B.

Figure 10:
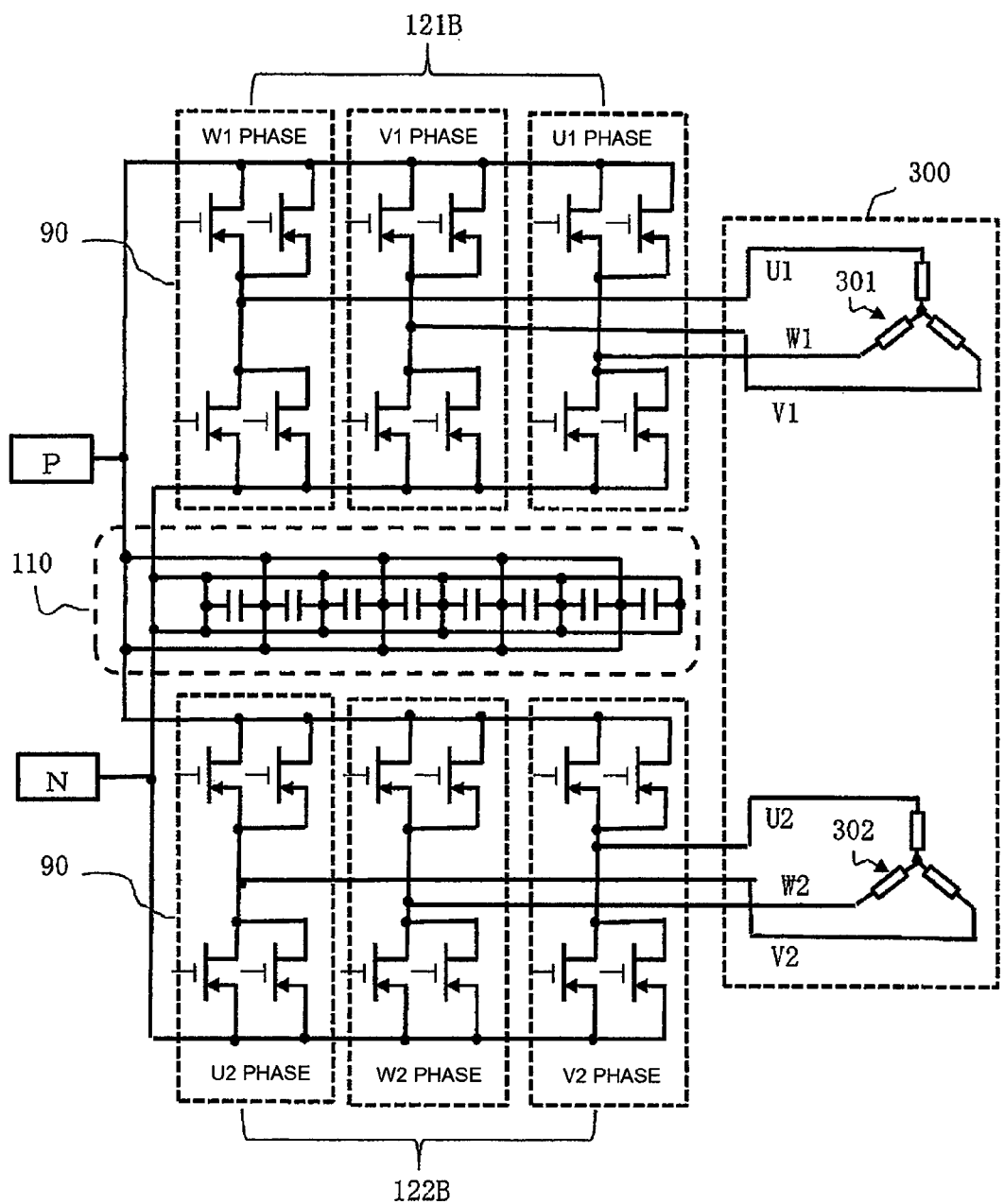
FIG. 10 is a diagram for illustrating the configuration of a power circuit of the power conversion unit of FIG. 9.

Next, referring to FIG. 10, a description is given of the configuration of a power circuit of the power conversion unit of FIG. 9, focusing on differences from that of FIG. 7. FIG. 10 is a diagram for illustrating the configuration of a power circuit thereof. In FIG. 7, the three unit modules 90 connected to the first three phase windings 301 of the three-phase AC motor 300 form the first opening/closing module 121B, and the three unit modules 90 connected to the second three phase windings 302 form the second opening/closing module 122B. Further, the circuit board 110 is arranged between the positive-side power supply terminal P and the negative-side power supply terminal N which receive a DC power supply voltage. On the circuit board 110, the numerous unit capacitors 113 are connected in parallel to form a power smoothing capacitor. Further, in the first opening/closing module 121B, the U1 phase, the V1 phase, and the W1 phase are connected to the first three phase windings 301 in the stated order, while in the second opening/closing module 122B, the V2 phase, the W2 phase, and the U2 phase are connected to the second three phase windings 302 in the stated order.

With this configuration, one of the capacitor groups within the circuit board 110 opposes the U1-phase and V2-phase unit modules 90, a middle one thereof opposes the V1-phase and W2-phase unit modules 90, and the remaining one thereof opposes the W1-phase and U2-phase unit modules 90. When the right and left unit modules 90 are arranged in different phase orders so that the capacitors can oppose the unit modules 90 of different phases, load currents flowing into one pair of unit modules 90 reach the maximum value with some delay. In this case, a total amount of the maximum currents is equal to a current amount in one unit module 90, so that a load on each unit capacitor group can be reduced to the half of a load applied when the capacitors are connected to the unit modules 90 of the same phase. This configuration is equivalent to such a configuration that a phase difference of 120 degrees is set between the three-phase AC voltage applied to the first three phase windings 301 and that to the second three phase windings 302 in the first embodiment.

Figure 11A:
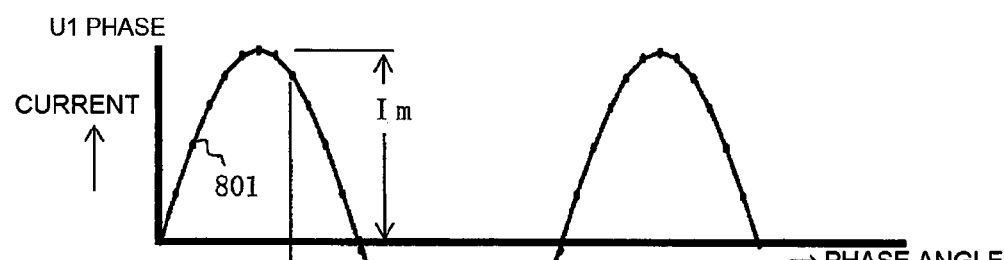
FIGS. 11A-11C are explanatory graphs for showing a characteristic curve of a waveform of a first added current in the power conversion unit of FIG. 9.
Figure 11B:
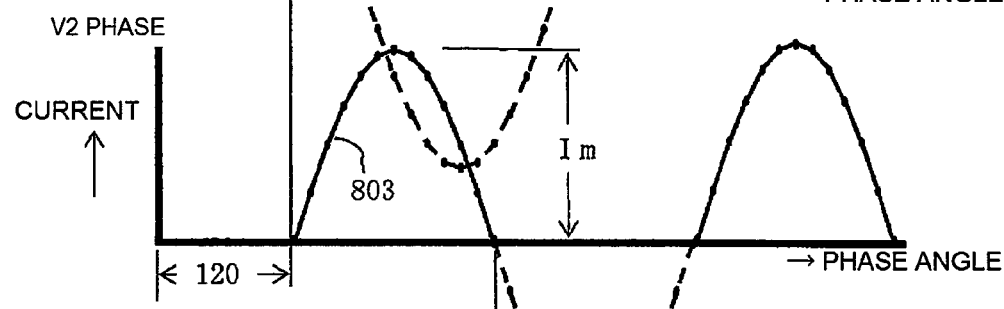
Figure 11C:
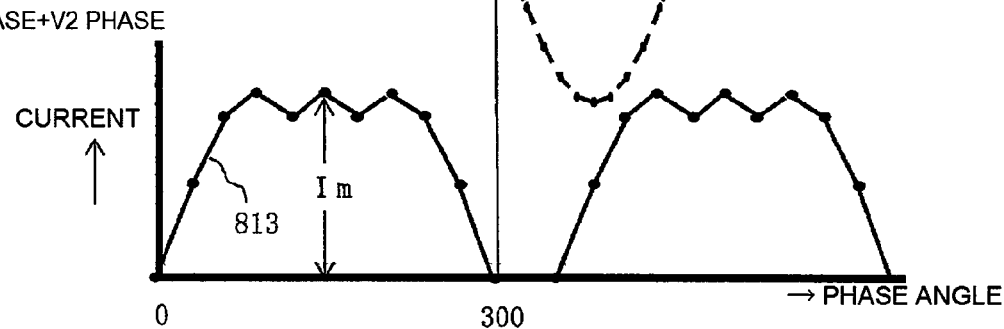

A detailed description thereof is given below with reference to FIG. 11. FIG. 11 are explanatory graphs for showing a characteristic curve of an added current waveform. In FIG. 8(A), a U1-phase basic waveform 801 is a sine waveform with a peak value Im, of a load current flowing into the U1-phase unit module 90. In actuality, however, the illustrated wave is a multistage pseudo sine wave, which is imposed by a wave of a high-frequency ripple current caused by intermittent operations of the opening/closing elements in the unit module 90. In FIG. 11(B), a V2-phase basic waveform 803 is a sine waveform with the peak current Im, of a load current flowing into the U2-phase unit module 90. In this case, the phase of the waveform 802 is retarded by 120 degrees from that of the U1-phase basic waveform 801. Further, a pseudo sine wave of the V2-phase basic waveform 803 is similarly imposed by a high-frequency ripple current caused by intermittent operations of the opening/closing elements in the unit module 90. In FIG. 11(C), a (U1 phase+V2 phase) added waveform 813 is a current waveform obtained by adding an instantons value of the U1-phase basic waveform 801 and that of the V2-phase basic waveform 803, and the maximum value of the waveform appears at three distributed points, i.e., phase angels of 90 degrees, 150 degrees, and 210 degrees. This maximum value Im corresponds to a value of one phase of a basic wave.

Next, a description is given of a characteristic curve shown in FIG. 12. FIG. 12 are explanatory graphs for showing the characteristic curve of a second added current waveform. In FIG. 12(A), the U1-phase basic waveform 801 is a sine waveform with a peak value Im, of a load current flowing into the U1-phase unit module 90. In actuality, however, the illustrated wave is a multistage pseudo sine wave, which is imposed by a wave of a high-frequency ripple current caused by intermittent operations of the opening/closing elements in the unit module 90 as described above. In FIG. 12(B), a 30-degree-advanced V2-phase waveform 804 is a sine waveform with the peak current Im, of a load current flowing into the V2-phase unit module 90. In this case, the phase of the waveform 804 is advanced by 30 degrees from that of the V2-phase basic waveform 803 of FIG. 11(B). Further, a pseudo sine wave of the 30-degree-advanced V2-phase waveform 804 is similarly imposed by a high-frequency ripple current caused by intermittent operations of the opening/closing elements in the unit module 90.

In FIG. 12(C), a (U1 phase+advanced V2 phase) added waveform 814 is a current waveform obtained by adding an instantaneous value of the U1-phase basic waveform 801 and that of the 30-degree-advanced V2-phase waveform 804, and the maximum value thereof is 1.41 Im at the phase angle of 135 degrees.

Figure 13A:
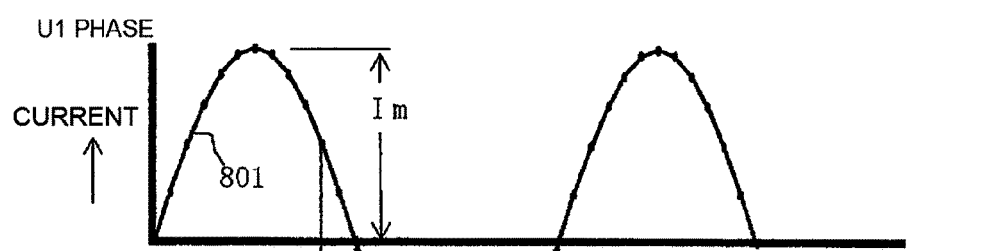
FIGS. 13A-13C are graphs for showing a characteristic curve of a waveform of a third added current in the power conversion unit of FIG. 9.
Figure 13B:
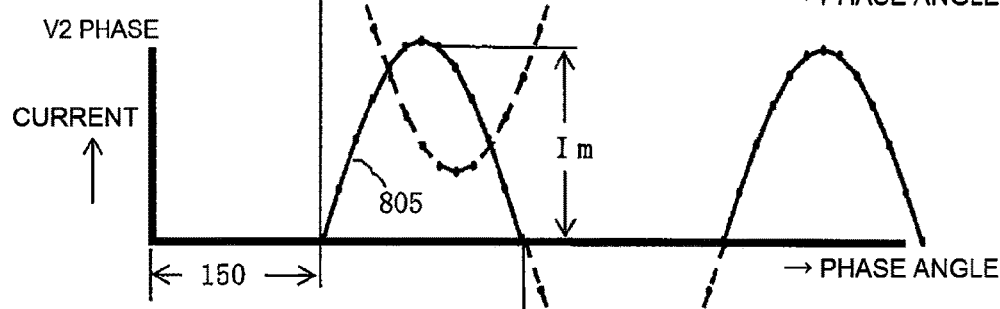
Figure 13C:
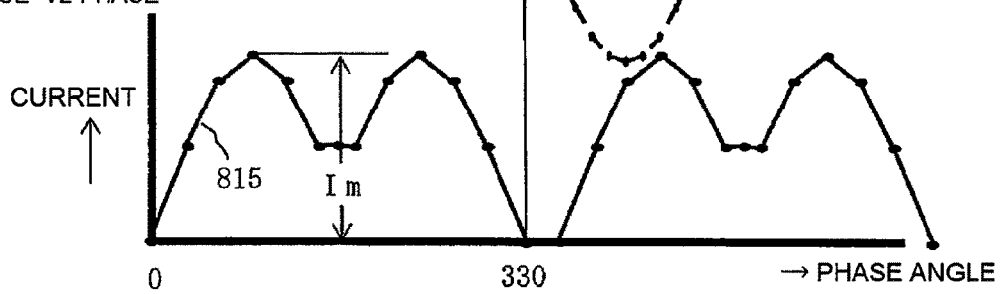

Next, a description is given of a characteristic curve shown in FIG. 13. FIG. 13 are explanatory graphs for showing the characteristic curve of a third added current waveform. In FIG. 13(A), the U1-phase basic waveform 801 is a sine waveform with a peak value Im, of a load current flowing into the U1-phase unit module 90. In actuality, however, the illustrated wave is a multistage pseudo sine wave, which is imposed by a wave of a high-frequency ripple current caused by intermittent operations of the opening/closing elements in the unit module 90 as described above. In FIG. 13(B), a 30-degree-delayed V2-phase waveform 805 is a sine waveform with the peak current Im, of a load current flowing into the V2-phase unit module 90. In this case, the phase of the waveform 804 is advanced by 30 degrees from that of the V2-phase basic waveform 803 of FIG. 11(B). Further, a pseudo sine wave of the 30-degree-advanced V2-phase waveform 804 is similarly imposed by a high-frequency ripple current caused by intermittent operations of the opening/closing elements in the unit module 90. In FIG. 13(C), a (U1 phase+V2 phase) added waveform 815 is a current waveform obtained by adding an instantons value of the U1-phase basic waveform 801 and that of the delayed V2-phase waveform 805, and the maximum value of the waveform appears at two distributed points, i.e., phase angels of 90 degrees and 240 degrees. This maximum value Im corresponds to a value of one phase of a basic wave.

Hence, when any control to suppress ripple variations during motor rotation is not performed, a phase difference of 120 degrees is set between the left unit module 90 of the U1 phase and a corresponding right-handed upper unit module 90, between the left unit module 90 of the V1 phase and a corresponding right-handed middle unit module 90, and between the left-handed unit module 90 of the W1 phase and a corresponding right-handed lower unit module 90 as illustrated in FIG. 11. With this operation, the maximum value Im of each added current can be reduced to a value corresponding to one phase of a basic wave. Further, when any control to suppress ripple variations during motor rotation is performed, a phase difference of 150 degrees is set between the left unit module 90 of the U1 phase and a corresponding right-handed upper unit module 90, between the left unit module 90 of the V1 phase and a corresponding right-handed middle unit module 90, and between the left unit module 90 of the W1 phase and a corresponding right-handed lower unit module 90. With this operation, the maximum value Im of each added current is suppressed to a value corresponding to one phase of a basic wave.

Meanwhile, as illustrated in FIG. 12, when a phase difference of 90 degrees is set between one pair of right and left unit modules 90, the maximum value of each added current is undesirably 1.41 Im. In the above-mentioned example, when the AC output terminals V2, W2, and U2 of the three right unit modules 90 of FIG. 9 are arranged in the stated order similar to the three left unit modules 90. In this case, when a phase difference of 120 degrees or 150 degrees is set between U1 and U2, V1 and V2, and W1 and W2, the same operational effects as the above-mentioned ones can be obtained. Further, in FIG. 1 and FIG. 9, the right and right sides, and the upper and lower sides are defined merely for ease of illustration of the embodiments, and actually are not intended to specify the direction of the paper, i.e., specify whether a target component is viewed from the front side of the paper or the rear side thereof, and from the upper side of the paper or the lower side thereof. Hence, the present invention encompasses variants with different vertical and horizontal positions. Moreover, the product of the present invention is attachable to any one of a celling surface, a floor surface, and a wall surface. The illustrated direction is not one that specifies the vertical direction for attachment. Assuming that the product is attached to the wall surface, the product can be freely attached while being oriented vertically or horizontally.

(2) Main Points and Characteristics of Second Embodiment

As is apparent from the description described above, a power conversion unit 100B according to a second embodiment of the present invention, includes: a power smoothing capacitor connected to a DC power supply 200; and a plurality of unit modules 90 connected in series to three phase windings of a three-phase AC motor 300 having first three phase windings 301 or the first three phase windings 301 and second three phase windings 302, so as to intermittently supply load current; and a control circuit unit 130 configured to execute opening/closing control of the plurality of unit modules 90 such that one type of three-phase AC voltage or one type of three-phase AC voltages are applied to any one of the first three phase windings 301, and the first three phase windings 301 and the second three phase windings 302, or two types of three-phase AC voltages having a predetermined phase difference are applied to the first three phase windings 301 and the second three phase windings 302 so that the three-phase AC voltages of the same frequency appear to have a variable frequency, wherein the power smoothing capacitor is configured by an assembly of a plurality of unit capacitors that are conductive polymer solid aluminum electrolytic capacitors or conductive polymer hybrid aluminum electrolytic capacitors, the unit capacitors 113 being connected in parallel through use of a circuit board 110, wherein on the circuit board 110, a plurality of positive-side patterns 110p and a plurality of negative-side patterns 110n are alternately arranged in a vertical direction, extending in a horizontal direction such that corresponding ones of the plurality of unit capacitors 113 are soldered in between adjacent ones of the positive-side patterns 110p and the negative-side patterns 110n, a lowermost one of the positive-side patterns 110p is connected to a positive-side power supply terminal P, and a lowermost one of the negative-side patterns 110n is connected to a negative-side power supply terminal N.

Right ends of the plurality of positive-side patterns 110p and left ends thereof are each connected to one another via a corresponding one of a copper-made or copper-alloy-made first positive-side bus bar 111p and a copper-made or copper-alloy-made second positive-side bus bar 112p, wherein right ends of the plurality of negative-side patterns 110n and left ends thereof are each connected to one another via a corresponding one of a copper-made or copper-alloy-made first negative-side bus bar 111n and a copper-made or copper-alloy-made second negative-side bus bar 112n, wherein the first positive-side bus bar 111p and the first negative-side bus bar 111n extend in parallel in the vertical direction, and are connected to corresponding ones of positive-side electrode terminals Pm and negative-side electrode terminals Nm of three unit modules 90 that form a first opening/closing module 121B out of the plurality of unit modules 90, and AC electrode terminals AC of the three unit modules are connected to the first three phase windings 301, and wherein the second positive-side bus bar 112p and the second negative-side bus bar 112n extend in parallel in the vertical direction, and are connected, when the second three phase windings 302 are provided, to corresponding ones of positive-side electrode terminals Pm and negative-side electrode terminals Nm of three unit modules 90 that form a second opening/closing module 122B out of the plurality of unit modules 90, and AC electrode terminals AC of the three unit modules are connected to the second three phase windings 302.

When the three-phase AC motor 300 includes the first three phase windings 301 and the second three phase windings 302, and one pair of three-phase AC voltages having a phase difference α that equals zero or a predetermined phase difference α are applied to the first three phase windings 301 and the second three phase windings 302, the three unit modules 90 on the left side of the circuit board 110, which form the first opening/closing module 121B used to supply a current to the first three phase windings 301, and the three unit modules 90 on the right side of the circuit board 110, which form the second opening/closing module 122B used to supply a current to the second three phase windings 302, are connected thereto while being shifted by one phase in a diagonally symmetric form.

As described above, the power conversion unit achieves the following feature in relation to claim 6 of the present invention. The unit modules on the left of the circuit board are arranged, for example, in the order of the U1 phase, the V1 phase, and the W1 phase, whereas the unit modules on the right of the circuit board are arranged, for example, in the order of the V2 phase, the W2 phase, and the U2 phase, so that the unit module of the U1 phase and that of the V2 phase, the unit module of the V1 phase and that of the W2 phase, and the unit module of the W1 phase and that of the U2 phase are opposite to each other across the circuit board. Thus, considering, by comparison, one arrangement in which the phase difference α=0, i.e., the right and left unit modules are of the same phase, and another arrangement in which the right and left unit modules have a phase difference of 120 degrees, the maximum load current flows through the right and left unit modules at the same time in the former arrangement, whereas in the latter arrangement, the maximum load current flows through one unit module while no load current flows through another unit module, so that the total maximum load current flowing through the right and left unit modules is reduced to a current flowing through one unit module. Thus, ripple currents generated in the plurality of unit capacitor groups arranged between the pair of unit modules can be considerably reduced. Note that, also when the phase difference α of 30 degrees, which is a typical one, is set between the first three phase windings and the second three phase windings, in a case where the phase difference between the U1 phase and the V2 phase is set to 150 degrees (120+30=150), the maximum load current is equivalent to that in one unit module. This value is considerably smaller than the maximum load current of twice a general one, which is generated when the two unit modules have the same phase.

When the three-phase AC motor 300 includes the first three phase windings 301 and the second three phase windings 302, and the unit modules 90 are connected thereto in a diagonally symmetric form, one pair of right and left unit modules 90 has the phase difference of (120+30) degrees. As described above, the power conversion unit achieves the following feature in relation to claim 7. The unit modules on the left of the circuit board are arranged in the order of, for example, the U1 phase, the V1 phase, and the W1 phase, while the unit modules on the right of the circuit board are arranged in the order of, for example, the V2 phase, the W2 phase, and the U2 phase, so that the U1-phase unit module and the V2-phase unit module, the V1-phase unit module and the W2-phase unit module, and the W1-phase unit module and the U2-phase unit module are each opposite to each other across the circuit board. In addition, the phase difference of (120+30) degrees is set between the U1 phase and the V2 phase, between the V1 phase and the W2 phase, and between the W1 phase and the U2 phase. Accordingly, ripple generated during motor rotation is reduced through setting of the additional phase difference of 30 degrees. In addition, the total maximum load current flowing into the right and left unit modules is halved to a current flowing into one unit module, so that ripple currents generated in the plurality of unit capacitor groups arranged between the pair of unit modules can be considerably reduced. Here, when the phase difference of (120-30) degrees is set in place of (120+30) degrees, the same effect of suppressing ripple during motor rotation is obtained, but the total maximum load current flowing into the right and left unit modules is 1.41 times the current flowing into one unit module. This increase cancels the effect of suppressing ripple currents generated in the unit capacitor groups.

The DC power supply 200 is an in-vehicle battery for use in an electric vehicle, which is a DC 48 V-compatible low-voltage battery, and the three-phase AC motor 300 is a motor for vehicle running, wherein the unit modules 90 include: at least one of a first upstream opening/closing element 91 and a second upstream opening/closing element 92 as a field effect transistor, which are connected to the positive-side electrode terminal Pm and at least one of a first downstream opening/closing element 93 and a second downstream opening/closing element 94 as a field effect transistor, which are connected to the negative-side electrode terminal Nm; upstream gate driving terminals 95 provided for the first and second upstream opening/closing elements 91, 92; downstream gate driving terminals 96 provided for the first and second downstream opening/closing elements 93, 94; and a corresponding one of the AC electrode terminals AC, which is provided at a node between the first and second upstream opening/closing elements 95 and the first and second downstream opening/closing elements 96, wherein the control circuit unit 130 includes a constant voltage power supply unit 133 configured to step down a power supply voltage of the DC power supply 200 to generate a stabilized control voltage Vcc, and a microprocessor 134 configured to operate with power supplied from the constant voltage power supply unit, and the microprocessor 134 serves to generate a gate signal to control opening/closing of the first opening/closing modules 121B or the first opening/closing modules 121B and the second opening/closing modules 122B so as to apply a three-phase AC voltage to each winding of the three-phase AC motor 300 including the first three phase windings 301 or the first three phase windings 301 and the second three phase windings 302, and also serves to execute control to perform regenerative charging of the in-vehicle battery or dynamic braking by utilizing a generated voltage of the three-phase AC motor 300 during coasting or downhill running, and wherein the plurality of unit modules 90 and the circuit board 110 are mounted on a cooling plate 150 having a cooling water path 151 so as to transfer heat, and a control board 135 configured to form the control circuit unit 130A and 130B is arranged opposite thereto, the control board 135 being connected to the upstream gate driving terminals 95 and the downstream gate driving terminals 96 used to send a first gate signal 131, or the first gate signal 131 and a second gate signal 132 to a corresponding one of the plurality of unit modules 90.

As described above, the power conversion unit achieves the following feature in relation to claim 8 of the present invention. The power conversion unit is configured to executes control for driving of the three-phase AC motor for vehicle running, and regenerative charging or dynamic braking with use of a low-voltage battery, in which an assembly of unit capacitors connected in parallel on the circuit board are used as the power smoothing capacitor, each unit module connected to a corresponding phase of the three-phase AC motor includes field effect transistors connected separately or in parallel in upstream positions and downstream positions, each unit module and the power smoothing capacitor are attached in close contact to the water-cooling plate, and the control circuit unit is arranged opposite to those components. Accordingly, in comparison with power conversion units for use in general electric vehicles with high-voltage batteries that withstand, for example, DC300V, large-current, low-loss field effect transistors connected separately or in parallel are used in each opening/closing module in place of general high-withstand-voltage bipolar transistors, and the power smoothing capacitor is configured by parallel-connected conductive polymer aluminum electrolytic capacitors in place of general high-voltage small-capacitance film capacitors, to thereby enable a large capacity. This configuration produces an effect that a low-voltage power conversion unit having a withstand voltage of less than DC60V, which causes no electric shock, can be achieved without increasing a size of the power conversion unit. The same applies to the first embodiment.

REFERENCE SIGNS LIST

90 unit modules, 91 first upstream opening/closing element, 92 second upstream opening/closing element, 93 first downstream opening/closing element, 94 second downstream opening/closing element, 95 upstream gate driving terminal, 96 downstream gate driving terminal, 100A, 100B power conversion unit, 110 circuit board, 110p positive-side pattern, 110n negative-side pattern, 111p first positive-side bus bar, 111*n* first negative-side bus bar, 112*p* second positive-side bus bar, 112*n* second negative-side bus bar, 1*p*, 1*n* solder terminal portion, 2*p*, 2*n* bus bar main body, 3*p*, 3*n* close connection portion, 4*p*, 4*n* welding connection portion, 113 unit capacitor, 114 surface conductive layer, 115 heat-transfer holding plate, 121A, 121B first opening/closing module, 122A, 122B second opening/closing module, 130 control circuit unit, 131 first gate signal, 132 second gate signal, 133 constant voltage power supply unit, 134 microprocessor, 135 control board, 150 cooling plate, 151 cooling water path, 200 DC power supply, 300 three-phase AC motor 301 first three phase winding, 302 second three phase winding, α phase difference, AC AC electrode terminal, N negative-side power supply terminal, Nm negative-side electrode terminal, P positive-side power supply terminal, Pm positive-side electrode terminal, Vcc stabilized control voltage.

The invention claimed is:

1. A power conversion unit comprising:
a power smoothing capacitor connected to a DC power supply;
a plurality of unit modules, which are connected in series to three phase windings of a three-phase AC motor including first three phase windings or the first three phase windings and second three phase windings, and are configured to intermittently supply load current; and
a control circuit unit configured to execute opening/closing control of the plurality of unit modules such that one type of three-phase AC voltage is applied to any one of the first three phase windings, and the first three phase windings and the second three phase windings, or two types of three-phase AC voltages having a predetermined phase difference therebetween are applied to the first three phase windings and the second three phase windings, and such that the three-phase AC voltages each has a relation having a variable phase for the same frequency,
wherein the power smoothing capacitor is configured by an assembly of a plurality of unit capacitors being conductive polymer solid aluminum electrolytic capacitors or conductive polymer hybrid aluminum electrolytic capacitors, the plurality of unit capacitors being connected in parallel through use of a circuit board,
wherein, on the circuit board, a plurality of positive-side patterns and a plurality of negative-side patterns, each extending in a horizontal direction, are alternately arrayed in a vertical direction, such that corresponding ones of the plurality of unit capacitors are soldered in between adjacent ones of the positive-side patterns and the negative-side patterns, a lowermost one of the positive-side patterns is connected to a positive-side power supply terminal, and a lowermost one of the negative-side patterns is connected to a negative-side power supply terminal,
wherein right ends of the plurality of positive-side patterns and left ends thereof are each connected to one another via a corresponding one of a copper-made or copper-alloy-made first positive-side bus bar and a copper-made or copper-alloy-made second positive-side bus bar,
wherein right ends of the plurality of negative-side patterns and left ends thereof are each connected to one another via a corresponding one of a copper-made or copper-alloy-made first negative-side bus bar and a copper-made or copper-alloy-made second negative-side bus bar,
wherein the first positive-side bus bar and the first negative-side bus bar are configured to extend in parallel in the vertical direction, and are connected to corresponding ones of positive-side electrode terminals and negative-side electrode terminals of three unit modules that form a first opening/closing module out of the plurality of unit modules, and AC electrode terminals provided to the three unit modules are connected to the first three phase windings, and
wherein the second positive-side bus bar and the second negative-side bus bar are configured to extend in parallel in the vertical direction, and are connected, when the second three phase windings are provided, to corresponding ones of positive-side electrode terminals and negative-side electrode terminals of three unit modules that form a second opening/closing module out of the plurality of unit modules, and the AC electrode terminals provided to the three unit modules are connected to the second three phase windings.

2. The power conversion unit according to claim 1,
wherein, between the positive-side patterns and the adjacent negative-side patterns on the circuit board, the capacitor rows each including three to five of the unit capacitors, which are connected in parallel, are formed,
in the capacitor rows, two each, six in total of the capacitor rows are adjacently arranged on right sides or left sides of each three unit modules including an upper unit module, an intermediate unit module, and a lower unit module;
wherein one of the capacitor rows is arranged in between the upper unit module and the intermediate unit module, and one of the capacitor rows is in between the lower unit module and the intermediate unit module; and
wherein one of the capacitor rows is additionally arranged above an uppermost one of the capacitor rows, and one of the capacitor rows is below a lowermost one of the capacitor rows, to thereby form total 10 rows of the capacitor rows.

3. The power conversion unit according to claim 1,
wherein the circuit board comprises an insulating substrate having a front surface to which a surface conductive layer is adhered to form the plurality of positive-side patterns and the plurality of negative-side patterns, and
wherein a copper-made or copper-alloy-made heat-transfer holding plate is adhered to a rear surface of the insulating substrate.

4. The power conversion unit according to claim 1,
wherein each of the unit modules forms a half bridge circuit of a square form, the half bridge circuit including at least one of a first upstream opening/closing element and a second upstream opening/closing element connected to the positive-side electrode terminal, at least one of a first downstream opening/closing element and a second downstream opening/closing element connected to the negative-side electrode terminal, upstream gate driving terminals provided for the first upstream opening/closing element and the second upstream opening/closing element, downstream gate driving terminals provided for the first downstream opening/closing element and the second downstream opening/closing element, and the AC electrode terminal, which is provided at a node between the first and second upstream opening/closing elements and the first and second downstream opening/closing elements, wherein the positive-side electrode terminal and the negative-side electrode terminal are arranged locally on one side of one pair of sides of the square form, and the AC electrode terminal is locally arranged on another side of the one pair of sides of the square form at a position diagonal to the positive-side electrode terminal and the negative-side electrode terminal, and wherein the upstream gate driving terminals and the downstream gate driving terminals are arranged next to the positive-side electrode terminal and the negative-side electrode terminal, or the AC electrode terminal on the one side or the another side of the one pair of sides of the square form.

5. The power conversion unit according to claim 1, wherein the first positive-side bus bar and the second positive-side bus bar are each formed by bending sequentially at a right angle a plurality of solder terminal portions to be soldered to the left ends and the right ends of the positive-side patterns of the circuit board, one bus bar main body extending vertically, a plurality of close connection portions, and positive-side welding connection portions, wherein the positive-side welding connection portions each form planar portions orthogonal to the circuit board, which serve as welding joint surfaces configured to abut with the positive-side electrode terminals of the unit modules, wherein the first negative-side bus bar and the second negative-side bus bar are each formed by bending sequentially at a right angle a plurality of solder terminal portions to be soldered to the right ends and the left ends of the negative-side patterns of the circuit board, one bus bar main body extending vertically, a plurality of close connection portions, and negative-side welding connection portions, and wherein the negative-side welding connection portions each form planar portions orthogonal to the circuit board, which serve as weld joint surfaces configured to abut with the negative-side electrode terminals of the unit modules.

6. The power conversion unit according to claim 1, wherein when the three-phase AC motor includes the first three phase windings and the second three phase windings, and one pair of three-phase AC voltages having a phase difference that equals zero or a predetermined phase difference are applied to the first three phase windings and the second three phase windings, the three unit modules on the left side of the circuit board, which form the first opening/closing module used to supply a current to the first three phase windings, and the three unit modules on the right side of the circuit board, which form the second opening/closing module used to supply a current to the second three phase windings, are connected thereto while being shifted by one phase in a diagonally symmetric form.

7. The power conversion unit according to claim 6, wherein, when the three-phase AC motor includes the first three phase windings and the second three phase windings, and the unit modules are connected thereto in a diagonally symmetric form, one pair of right and left unit modules has the phase difference of (120+30) degrees.

8. The power conversion unit according to claim 1, wherein the DC power supply is an in-vehicle battery for use in an electric vehicle, which is a DC48V-compatible low-voltage battery, and the three-phase AC motor is a motor for vehicle running, wherein the unit modules include: at least one of a first upstream opening/closing element and a second upstream opening/closing element as a field effect transistor, which are connected to the positive-side electrode terminal and at least one of a first downstream opening/closing element and a second downstream opening/closing element as a field effect transistor, which are connected to the negative-side electrode terminal; upstream gate driving terminals provided for the first and second upstream opening/closing elements; downstream gate driving terminals provided for the first and second downstream opening/closing elements; and a corresponding one of the AC electrode terminals, which is provided at a node between the first and second upstream opening/closing elements and the first and second downstream opening/closing elements, wherein the control circuit unit includes a constant voltage power supply unit configured to step down a power supply voltage of the DC power supply to generate a stabilized control voltage, and a microprocessor configured to operate with power supplied from the constant voltage power supply unit, and the microprocessor serves to generate a gate signal to control opening/closing of the first opening/closing modules or the first opening/closing modules and the second opening/closing modules so as to apply a three-phase AC voltage to each winding of the three-phase AC motor including the first three phase windings or the first three phase windings and the second three phase windings, and also serves to execute control to perform regenerative charging of the in-vehicle battery or dynamic braking by utilizing a generated voltage of the three-phase AC motor during coasting or downhill running, and wherein the plurality of unit modules and the circuit board are mounted on a cooling plate having a cooling water path so as to transfer heat, and a control board configured to form the control circuit unit is arranged opposite thereto, the control board being connected to the upstream gate driving terminals and the downstream gate driving terminals used to send a first gate signal, or the first gate signal and a second gate signal to a corresponding one of the plurality of unit modules.

* * * * *